United States Patent
Zanuso et al.

(10) Patent No.: US 9,893,875 B2
(45) Date of Patent: Feb. 13, 2018

(54) PHASE CONTINUITY TECHNIQUE FOR FREQUENCY SYNTHESIS

(71) Applicant: QUALCOMM Incorporated, San Diego, CA (US)

(72) Inventors: Marco Zanuso, Encinitas, CA (US); Mohammad Elbadry, San Diego, CA (US); Tsai-Pi Hung, San Diego, CA (US); Ravi Sridhara, San Diego, CA (US); Francesco Gatta, San Diego, CA (US); Jingcheng Zhuang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/270,444

(22) Filed: Sep. 20, 2016

(65) Prior Publication Data

US 2017/0338940 A1 Nov. 23, 2017

Related U.S. Application Data

(60) Provisional application No. 62/340,415, filed on May 23, 2016.

(51) Int. Cl.
*H03D 3/24* (2006.01)
*H04L 7/033* (2006.01)
(Continued)

(52) U.S. Cl.
CPC ............... *H04L 7/033* (2013.01); *H03L 7/14* (2013.01); *H03L 7/143* (2013.01); *H03L 7/1976* (2013.01); *H04L 5/14* (2013.01); *H04L 69/28* (2013.01); *H03L 2207/08* (2013.01); *H04W 84/042* (2013.01)

(58) Field of Classification Search
CPC ...... H04B 1/0475; H04B 1/406; H04B 1/408; H04L 25/028; H04L 27/127; H03L 7/1974; Y02B 60/50
See application file for complete search history.

(56) References Cited

U.S. PATENT DOCUMENTS 6,008,703 A 12/1999 Perrott et al.
6,265,947 B1 7/2001 Klemmer et al.
(Continued)

OTHER PUBLICATIONS

Qinghong, "Delta-Sigma Fractional-N Synthesizers Enable Low-Cost, Low-Power, Frequency Agile Software Radio", EE Times, Electronics Design Engineer, Conexant Systems, Dec. 9, 2000, 16 Pages.

(Continued)

*Primary Examiner* — Khanh C Tran
(74) *Attorney, Agent, or Firm* — Qualcomm Incorporated/Seyfarth Shaw LLP

(57) ABSTRACT

A phase discontinuity mitigation implementation within a phased lock loop (PLL) improves throughput of a radio access technology. The throughput is improved by maintaining a phase of the PLL while powering off some devices of the PLL, such as a local oscillator (LO) frequency divider. In one instance, when the PLL is powered down, one or more portions of a delta sigma modulator for the PLL are clocked with a reference clock for the PLL. This implementation maintains phase continuity when the first phase lock loop turns back on.

17 Claims, 25 Drawing Sheets

(51) Int. Cl.
*H04L 29/06* (2006.01)
*H04L 5/14* (2006.01)
*H03L 7/14* (2006.01)
*H03L 7/197* (2006.01)
*H04W 84/04* (2009.01)

(56) References Cited

U.S. PATENT DOCUMENTS

| | | | | |
|---|---|---|---|---|
| 6,359,983 | B1* | 3/2002 | Krone | H04L 25/0266 375/285 |
| 6,442,271 | B1* | 8/2002 | Tuttle | H04L 25/0266 379/399.01 |
| 8,258,835 | B1 | 9/2012 | Morand et al. | |
| 8,588,329 | B2* | 11/2013 | Lamanna | H03L 7/1976 375/295 |
| 8,604,851 | B2 | 12/2013 | Lee et al. | |
| 2009/0003501 | A1* | 1/2009 | Steinbach | H03L 7/0991 375/376 |
| 2009/0212835 | A1 | 8/2009 | Xu et al. | |
| 2010/0315138 | A1 | 12/2010 | Namba et al. | |
| 2012/0288035 | A1* | 11/2012 | Karthaus | H03M 3/508 375/340 |
| 2016/0226502 | A1* | 8/2016 | Cali | H03L 7/1974 |

OTHER PUBLICATIONS

Staszewski, et al., "All-Digital PLL and Transmitter for Mobile Phones", IEEE Journal of Solid-State Circuits, vol. 40, No. 12, Dec. 2005, pp. 2469-2482.
International Search Report and Written Opinion—PCT/US2017/025547—ISA/EPO—dated Jul. 17, 2017.

* cited by examiner

PHASE CONTINUITY TECHNIQUE FOR FREQUENCY SYNTHESIS

CROSS-REFERENCE TO RELATED APPLICATION

The present application claims the benefit of U.S. Provisional Patent Application No. 62/340,415, filed on May 23, 2016, and titled "PHASE CONTINUITY TECHNIQUE FOR FREQUENCY SYNTHESIS," the disclosure of which is expressly incorporated by reference herein in its entirety.

BACKGROUND

Technical Field

The present disclosure relates generally to wireless communication systems, and more specifically to a phase discontinuity mitigation technique within a phased lock loop.

Related Art

In a long term evolution (LTE) communication network, uplink radio resources may be allocated dynamically to user equipment (UE) based on different applications, data rates, and quality of service (QoS) specifications. Specifically, a UE in an LTE communication network may be allocated varying numbers of resource blocks (RBs) for uplink transmissions from the UE. Each RB may extend over one slot period (e.g., 0.5 milliseconds (ms)) in the time domain while occupying a certain range (e.g., 180 kilohertz (kHz)) in the frequency domain. The RB allocation for a UE may vary in both bandwidth and frequency range between consecutive LTE sub-frames (e.g., two 0.5 ms slot periods). Based on the RB allocation, the UE may transmit data at the center frequency of the allocated RBs.

A conventional transmit path may include a frequency mixer that modulates a carrier signal from a local oscillator (LO) with a modulating signal from a baseband filter (BBF) representing the data to be transmitted. The carrier signal may have a fixed frequency that is relatively high. By contrast, the frequency of the modulating signal may be at the baseband (e.g., near zero hertz). Moreover, the frequency of the modulating signal may be varied in order to achieve an output signal at the center frequency of the allocated RBs. Up-converting the modulating signal from the baseband to the frequency of the carrier signal may give rise to spurious signal emissions including for example, but not limited to, residual sideband (RSB) signals and intermodulation (IM) products (e.g., primary and second 4FMOD signals).

In particular, when RB allocation is narrow (e.g., one RB), the operation of a conventional transmit path may generate spectral emission masks (SEMs) that fall outside of the frequency band allocated to a UE and interfere with transmissions on other channels. A UE may adopt additional maximum power reduction (AMPR) parameters in order to suppress spurious signal emissions to conform to $3^{rd}$ Generation Partnership Project (3GPP) LTE specifications. However, adoption of AMPR parameters may reduce the output power of the UE and thus limit the UE's coverage area.

SUMMARY

A method for wireless communication may include powering down a first phase lock loop. The method may further include clocking one or more portions of a delta sigma modulator with a reference clock for the first phase lock loop when the first phase lock loop powers down. The method also includes maintaining phase continuity when the first phase lock loop turns back on.

A method for wireless communication may include changing a frequency of a phase lock loop from a first frequency to a second frequency. The method may further include switching between a first delta sigma modulator and a second delta sigma modulator when the frequency of the phase lock loop changes, while maintaining power on both the first delta sigma modulator and a clock of the first delta sigma modulator. The method also includes maintaining phase continuity when the phase lock loop returns to the first frequency.

An apparatus for wireless communication may include a first phase lock loop including a delta sigma modulator. The apparatus may further include a control unit coupled to the first phase lock loop. The control unit may be configured to cause the first phase lock loop to power down. Furthermore, the apparatus includes a reference clock device coupled to the delta sigma modulator. The reference clock device generates a reference clock signal to clock one or more portions of the delta sigma modulator with the reference clock signal when the first phase lock loop powers down. The control unit maintains phase continuity when the first phase lock loop turns back on based on the clocking.

An apparatus for wireless communication may include a control unit coupled to a phase lock loop. The apparatus may further include a first delta sigma modulator coupled to the phase lock loop. Furthermore, the apparatus includes a second delta sigma modulator coupled to the phase lock loop. The control unit changes a frequency of the phase lock loop from a first frequency to a second frequency. The control unit causes a switch between the first delta sigma modulator and the second delta sigma modulator when the frequency of the phase lock loop changes, while maintaining power on both the first delta sigma modulator and a clock of the first delta sigma modulator. The control unit maintains phase continuity when the phase lock loop returns to the first frequency based on the maintaining of the power on both the first delta sigma modulator and the clock of the first delta sigma modulator.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

Aspects and features of the present disclosure will be more apparent by describing example aspects with reference to the accompanying drawings, in which.

DETAILED DESCRIPTION

Figure 1:
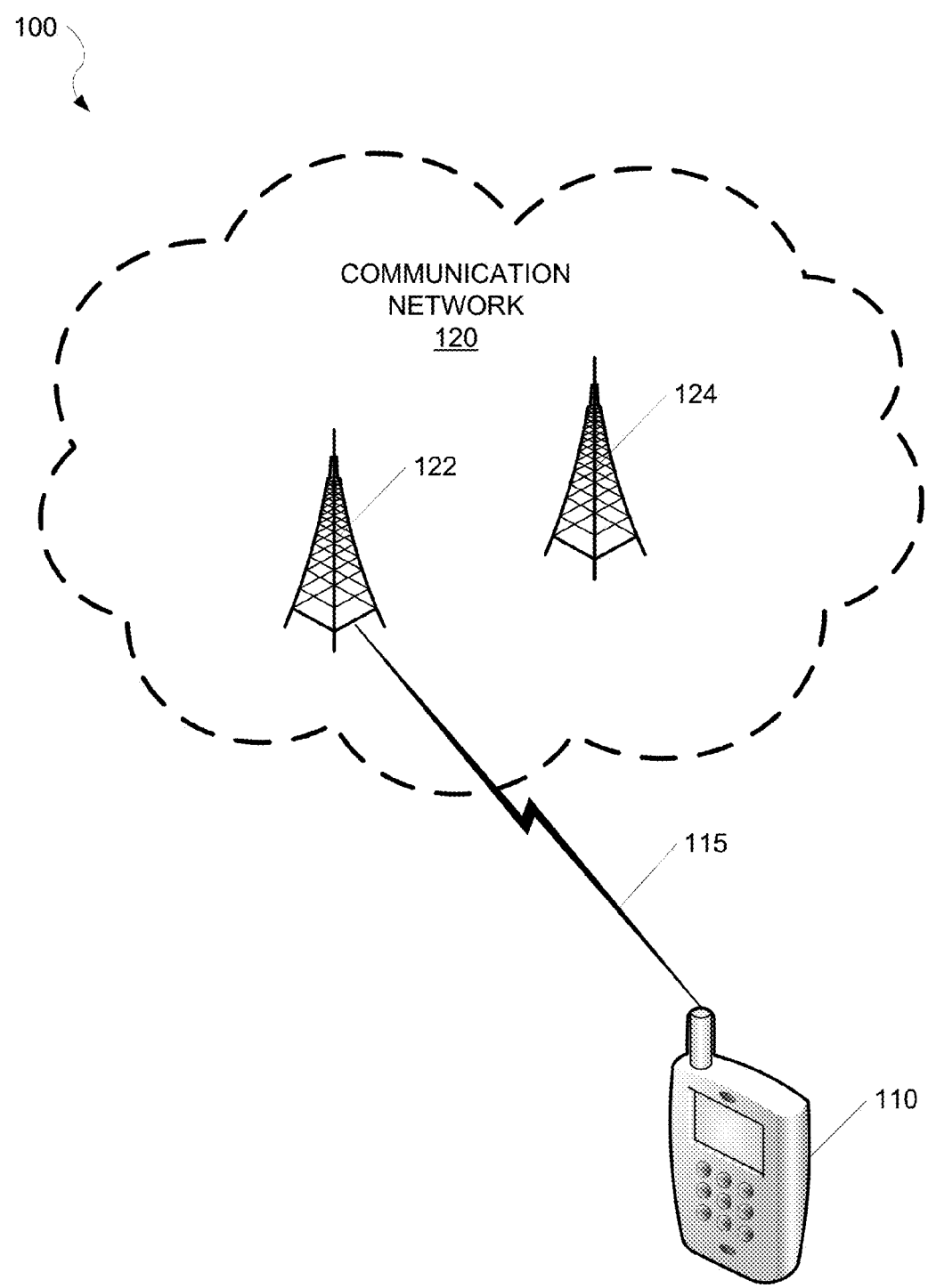
FIG. 1 is a system diagram illustrating a network environment according to various aspects of the present disclosure.

While a number of aspects are described herein, these aspects are presented by way of example only, and are not intended to limit the scope of protection. The apparatuses and methods described herein may be embodied in a variety of other forms. Furthermore, various omissions, substitutions, and changes in the form of the example apparatuses and methods described herein may be made without departing from the scope of protection.

A phase lock loop (PLL) (e.g., PLL circuit) is often an important component of a device that is designed to operate in a wireless communication system. The PLL forces the voltage controlled oscillator (VCO) to replicate and track a reference frequency and phase at an input when the PLL is in lock configuration. When locked, the frequencies of the input (e.g., at a phase detector) and output (e.g., at a VCO) are tracked exactly (e.g., input frequency=output frequency). A phase offset, however, may exist between the input and output.

A PLL reference frequency may be derived from a local oscillator (e.g., crystal oscillator, (XO)). For example, a frequency of the crystal oscillator may be around tens of megahertz (MHz) while a frequency of the VCO may be specified to generate a periodic signal in the GHz range. In this case, a frequency divider by N is interposed between the VCO and the phase detector. When locked, the frequency at an output of the PLL (e.g., at a VCO) is tracking exactly at N times the frequency at an input of the PLL (e.g., at a phase detector). For example, N*input frequency is equal to the output frequency. Thus, the output frequency of the VCO is set at a fractional multiple of the frequency by the frequency divider. A frequency divider modulus control implemented within the PLL may be scrambled by a digital delta-sigma modulator (DSM). The VCO output can be used as a local oscillator (LO) or to generate a clock signal for a digital system.

Considering a transceiver chain (e.g., transmit (Tx)/receive (Rx) chains), a receive (Rx) chain of the transceiver chain may include a phase lock loop (PLL) that drives a receive local oscillator ($Rx_{LO}$ or LO for the receive chain). The PLL generates a frequency (e.g., $Rx_{LO}$) at an output of a local oscillator (LO) frequency divider. Similarly, the transmit chain of the transceiver chain may include a PLL that drives a transmit local oscillator ($Tx_{LO}$). Therefore, the PLL generates a frequency during a $Tx_{LO}$ frequency divider and a baseband.

The Rx chain may be shut down during transmission and the Tx chain may be shut down during reception. However, when a divider (e.g., PLL frequency divider and/or $Rx_{LO}$ frequency divider) is shut down and subsequently restarted, the phase of the divider and/or PLL after the restart may be different from the phase of the divider and/or PLL before the shutdown, which causes phase uncertainty. For example, the phase uncertainty may manifest as a PLL phase uncertainty (e.g., at the output of the PLL) and/or LO phase uncertainty (e.g., at an output of a local oscillator (LO) frequency divider). It is therefore desirable to develop a phase lock loop implementation to mitigate the phase uncertainty. Another problem regarding a single PLL implementation, is that the single PLL cannot be used for both receive and transmit chains because of a failure to maintain the PLL and/or local oscillator phase according to specification. Accordingly, it is desirable to improve the performance of a phase lock loop (PLL) circuit.

Phase Continuity Technique for Frequency Synthesis

Aspects of the present disclosure are directed to achieving phase continuity or maintaining phase of a phase lock loop (PLL). In one aspect of the disclosure, the phase is maintained during transmission of signals when all or portions of the PLL (e.g., corresponding to a receive mode of operation) are powered off or portions of a communication chain (e.g., receive chain) are powered off. The phase continuity is achieved at an output of the PLL (e.g., an output of a voltage controlled oscillator (VCO) of the PLL). In addition or alternative to achieving phase continuity at an output of the PLL, the phase continuity is achieved at an output of a local oscillator (LO) frequency divider. The LO frequency divider may be coupled to the output of the PLL. Some of the portions that may be powered off include the LO frequency divider and the PLL. Although aspects of the disclosure are directed to powering down all or portions of the PLL or portions of a communication associated with the receive mode of operation, aspects can also be implemented when powering down during a transmit mode of operation.

In one aspect of the present disclosure, the phase at the output of the PLL is maintained by maintaining phase information in a device associated with the PLL when all or portions of the PLL are powered down. According to a first implementation, the phase of the PLL is maintained by maintaining power on a delta sigma modulator when one or more portions of the PLL or all of the PLL is powered down. For example, the PLL, the PLL frequency divider and/or the VCO associated with a receive mode of operation may be powered down or turned off during a transmit mode of operation. Alternatively, during the receive mode of operation, portions of the PLL supporting the transmit mode of operation are turned off.

In one aspect of the disclosure, the powering down of a receive PLL occurs during a transmit subframe in time division duplex (TDD) communications. In some aspects, the PLL may be a shared PLL between the transmit mode of operation and the receive mode of operation. In this case, only portions of a PLL system associated with the receive or transmit mode of operation are powered down.

Power and clock to the delta sigma modulator may be maintained in order to maintain a phase of the PLL. For example, power and clock to the delta sigma modulator is maintained to maintain the phase of the PLL corresponding to the receive mode of operation when portions of the PLL supporting the receive mode of operation are turned off In one aspect of the disclosure, clock to one or more portions of the delta sigma modulator is maintained by providing the PLL reference clock to the delta-sigma modulator. For example, the one or more portions of the delta sigma modulator are clocked with a reference clock ($F_{ref}$) for the PLL when the PLL is turned off to achieve phase continuity at the output of the VCO. The delta sigma modulator tracks the phase of the PLL so that when the PLL is powered on, the phase of the PLL is maintained. In one aspect, a delta sigma modulator including multiple accumulators may maintain power on only a single accumulator that stores phase information.

Because the phase at the output of the PLL is tracked by the reference phase and a state of the delta sigma modulator (phase information stored in the delta sigma modulator), powering down the delta sigma modulator causes the state of the delta sigma modulator to be lost. Losing the state of the delta sigma modulator causes the PLL to lock to a different phase (causing phase discontinuity) when the delta sigma modulator is turned on again. Accordingly, aspects of the present disclosure are directed to maintaining power on a portion or on all of the delta sigma modulator to maintain the state of the delta sigma modulator. Thus, when the PLL is powered back on, the phase of the PLL is maintained. Alternatively, the power may be maintained at any device that stores the phase information for maintaining the phase of the PLL.

In some implementations, the user equipment (UE) may include a single PLL supporting a transmit chain and a receive chain. Alternatively, each chain (e.g., receive chain and transmit chain) is supported by a separate PLL. In this case, only portions of the PLL corresponding to the receive chain are powered down during the transmit mode of operation.

In another implementation, a PLL system may include multiple delta sigma modulators (e.g., first and second delta sigma modulators). To maintain phase continuity when a frequency of the PLL changes, power is maintained at the first and the second delta sigma modulators while switching between the first and the second delta sigma modulators when the PLL frequency changes. For example, the PLL frequency changes when transitioning to a transmit subframe in time division duplex (TDD) communications. The first delta sigma modulator may include a receive delta sigma modulator and the frequency change may be the difference between a receive frequency and a transmit frequency. The second delta sigma modulator may include a transmit delta sigma modulator.

In some implementations, when receiving (e.g., in a frequency division duplex (FDD) system), a receive chain or path (e.g., a receiver of the receive chain) may transition to sleep mode to save power. After the sleep mode, the receiver continues to receive signals. In one aspect of the disclosure, power to the delta sigma modulator corresponding to the receiver is maintained during the sleep mode to maintain the phase of the PLL (e.g., receive PLL) at a same level before and after the sleep mode. In some systems (e.g., FDD systems), multiple PLLs are available to support receiving and transmitting. For example, a first PLL may be allocated for receiving and a second PLL for transmitting. To maintain phase continuity, the first PLL allocated for receiving is powered off during sleep mode while the delta sigma modulator and clock of the first PLL stay active to maintain phase continuity.

Some aspects of the present disclosure detect an error in a phase of the output of the LO frequency divider. To correct a phase at the output of the LO frequency divider, the phase of the PLL is sampled after the LO frequency divider and fed back to the PLL. For example, feedback is sent from an output of the LO frequency divider via a flip flop to the first PLL (e.g., receive PLL) to correct a phase at the output of the LO frequency divider.

The aspects of the present disclosure are beneficial to increase the throughput of a radio access technology (e.g., LTE). In LTE, for example, there is a specification to keep the same phase in a receive cycle or receive mode of operation. Accordingly, maintaining the phase of the PLL is beneficial for maximizing or improving throughput in LTE communication. For example, aspects of the present disclosure maintain the phase of the receive PLL while powering off the LO frequency divider and the receive PLL.

Further, the techniques described herein achieve power savings when using a dual PLL for TDD. The techniques also achieve a single PLL solution for LTE, LTE-TDD, etc., which results in area savings for both the transmit chain and the receive chain because of the elimination of a PLL.

FIG. 1 is a system diagram illustrating a network environment 100 according to various aspects. A communication network 120 may include one or more evolved universal mobile telecommunications system (UMTS) terrestrial radio access (E-UTRA) Node Bs (eNodeBs) including, for example, but not limited to, a first eNodeB 122 and a second eNodeB 124. The communication network 120 may be, for example, but not limited to, a wireless or mobile communication network.

The communication network 120 may be an LTE communication network. However, a person having ordinary skill in the art can appreciate that the communication network 120 may support different and/or additional radio access technologies (RATs), including, for example, but not limited to, wideband code division multiple access (WCDMA), global system for mobile communications (GSM), and time division-synchronous code division multiple access (TD-SCDMA) without departing from the scope of the present disclosure.

A mobile communication device 110 may communicate with the communication network 120 on a subscription 115 via the first eNodeB 122. For example, the mobile communication device 110 may transmit data to and receive data from the communication network 120 via the first eNodeB 122. A person having ordinary skill in the art can appreciate that the mobile communication device 110 may communicate with the communication network 120 on the subscription 115 via a different eNodeB (e.g., the second eNodeB 124) without departing from the scope of the present disclosure. Moreover, a person having ordinary skill in the art can appreciate that the mobile communication device 110 may communicate with different and/or additional communication networks on the subscription 115 and/or a different subscription without departing from the scope of the present disclosure.

Figure 2:
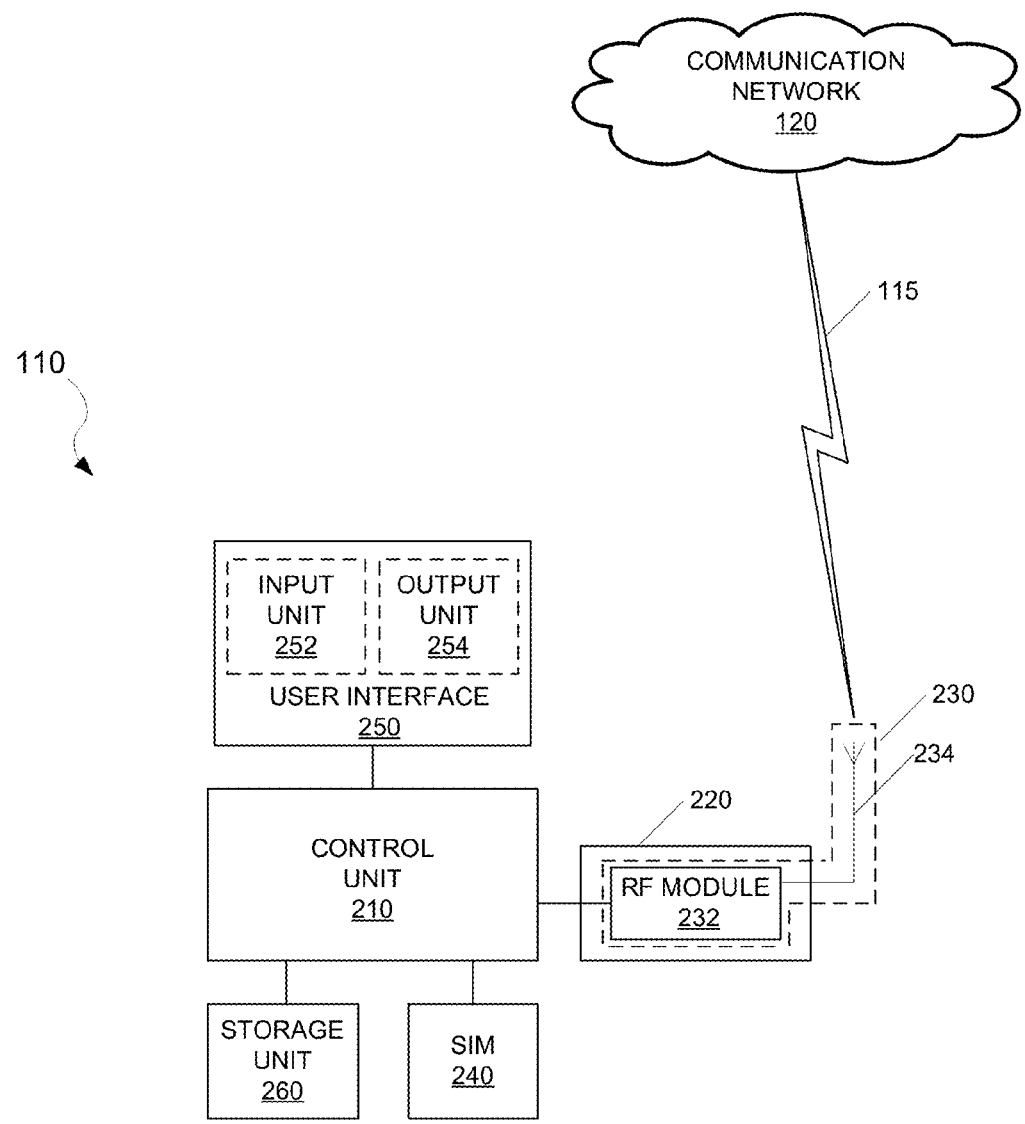
FIG. 2 is a block diagram illustrating a mobile communication device according to various aspects of the present disclosure.

FIG. 2 is a block diagram illustrating a mobile communication device 110 according to various aspects. Referring to FIGS. 1 and 2, the mobile communication device 110 may include a control unit 210, a communication unit 220, a subscriber identity module (SIM) 240, a user interface 250, and a storage unit 260.

The mobile communication device 110 may be any device capable of wirelessly communicating with one or more communication networks including, for example, but not limited to, the communication network 120. The mobile communication device 110 may be, for example, but not limited to, a smartphone, a tablet PC, or a laptop computer.

The SIM 240 may associate the communication unit 220 with the subscription 115 on the communication network 120. Although the mobile communication device 110 is shown to include a single SIM (e.g., the SIM 240), a person having ordinary skill in the art can appreciate that the mobile communication device 110 may include additional SIMs without departing from the scope of the present disclosure. The additional SIMs may associate the communication unit 220 with a different subscription on the communication network 120 or a different communication network.

The SIM 240 may be a universal integrated circuit card (UICC) that is configured with SIM and/or universal SIM (USIM) applications, enabling access to GSM and/or UMTS networks. The UICC may also provide storage for a phone book and other applications. Alternatively, in a CDMA network, a SIM may be a UICC removable user identity module (R-UIM) or a CDMA subscriber identity module (CSIM) on a card. A SIM card may have a central processing unit (CPU), read-only memory (ROM), random-access memory (RAM), electrically erasable programmable read-only memory (EEPROM) and input/output (I/O) circuits. An integrated circuit card identity (ICCID) SIM serial number may be printed on the SIM card for identification. However, a SIM may be implemented within a portion of memory of the mobile communication device 110, and thus need not be a separate or removable circuit, chip, or card.

The communication unit 220 may include an RF chain 230. The RF chain 230 may include, for example, but not limited to, an RF module or device 232 and an antenna 234. Although the mobile communication device 110 is shown to include a single communication unit (e.g., the communication unit 220), a person having ordinary skill in the art can appreciate that the mobile communication device 110 may include additional communication units without departing from the scope of the present disclosure.

The user interface 250 may include an input unit 252. The input unit 252 may be, for example, but not limited to, a keyboard or a touch panel. The user interface 250 may further include an output unit 254. The output unit 254 may be, for example, but not limited to, a liquid crystal display (LCD) or a light emitting diode (LED) display. A person having ordinary skill in the art will appreciate that other types or forms of input and output units may be used without departing from the scope of the present disclosure.

The control unit 210 may be configured to control the overall operation of the mobile communication device 110 including controlling the functions of the communication unit 220 including, for example, but not limited to, frequency synthesis performed by the RF module 232. The control unit 210 may be, for example, but not limited to, a microprocessor (e.g., general-purpose processor, baseband modem processor, etc.) or a microcontroller.

The storage unit 260 may be configured to store application programs, application data, and user data. At least some of the application programs stored at the storage unit 260 may be executed by the control unit 210 for the operation of the mobile communication device 110.

Figure 3:
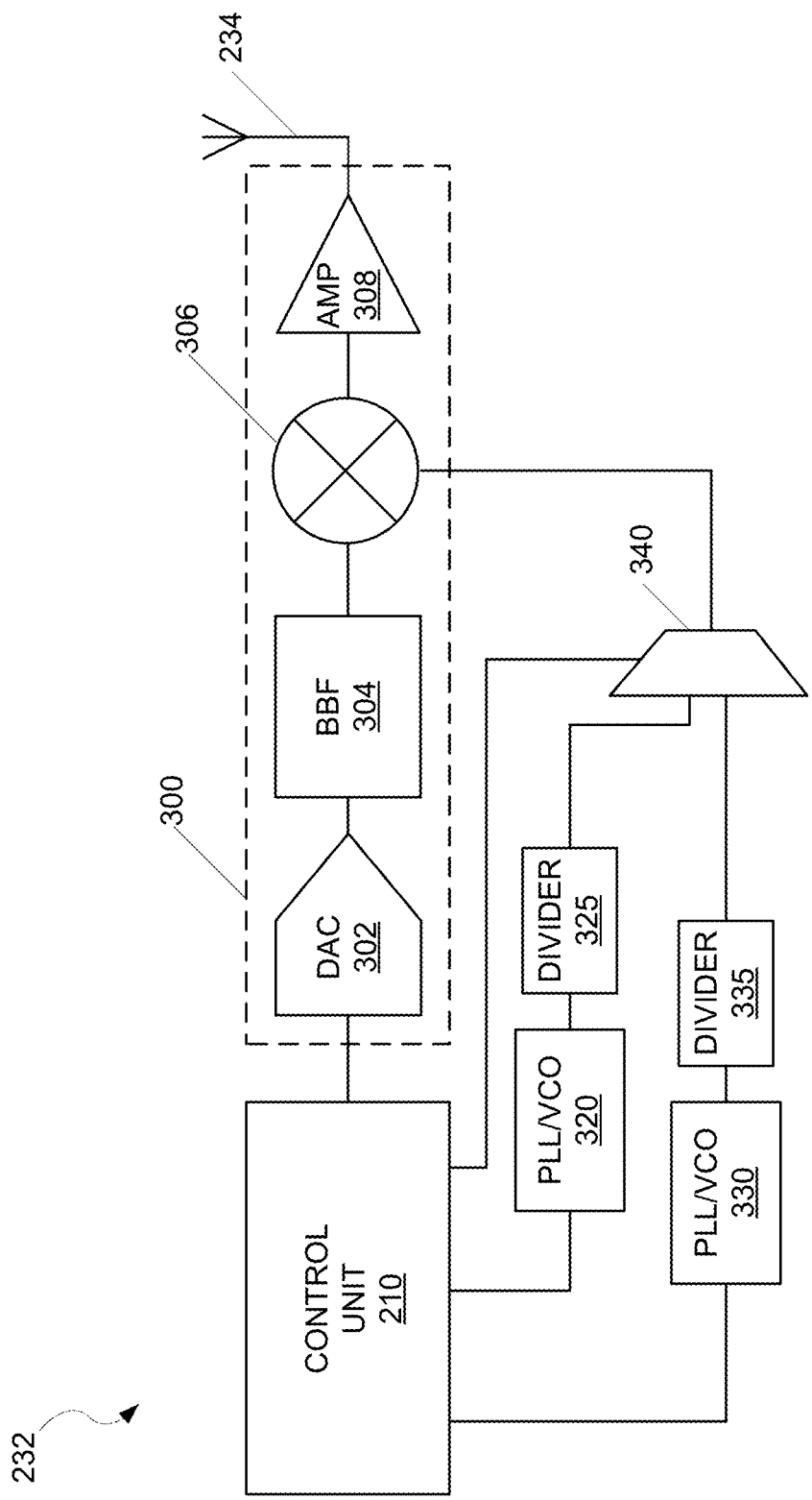
FIG. 3 is a block diagram illustrating a radio frequency (RF) device according to some aspects of the present disclosure.

FIG. 3 is a block diagram illustrating the RF module or device 232 according to some aspects. Referring to FIGS. 1, 2, and 3, the RF module 232 may include a transmit path 300 and a PLL selector 340.

The RF module 232 may further include multiple local oscillators (LO). The oscillators may comprise multiple phase lock loops (PLLs) with corresponding voltage controlled oscillators (VCOs) (PLL/VCOs) including, for example, but not limited to, a first PLL/VCO 320 and a second PLL/VCO 330. According to one exemplary aspect, the RF module 232 may include two PLL/VCOs (e.g., the first PLL/VCO 320 and the second PLL/VCO 330).

The first PLL/VCO 320 may be coupled with a first divider 325. The first PLL/VCO 320 may receive a reference signal having a reference frequency $F_{ref}$ from the control unit 210 and output a signal to the first divider 325. The combination of the first PLL/VCO 320 and the first divider 325 may be configured to generate and output a frequency divided signal that is synchronized to the phase and the frequency (e.g., $F_{ref}$) of the reference signal.

The second PLL/VCO 330 may be coupled with a second divider 335. The second PLL/VCO 330 may receive a reference signal having a reference frequency $F_{ref}$ from the control unit 210 and output a signal to the second divider 335. The combination of the second PLL/VCO 330 and the second divider 335 may be configured to generate and output a signal that is synchronized to the phase and the frequency (e.g., $F_{ref}$) of the reference signal.

In one implementation, an output signal from a PLL/VCO may be an undivided output signal, thus allowing for the omission of dividers.

The mobile communication device 110 may transmit data to the communication network 120 via the transmit path 300 according to a current RB allocation. The control unit 210 may receive from the communication network 120 an upcoming RB allocation for the mobile communication device 110. For example, the control unit 210 may be notified of the upcoming RB allocation on the physical downlink control channel (PDCCH) in advance (e.g., 4-8 slot periods).

The upcoming RB allocation may be different from a current RB allocation. For example, the upcoming RB allocation may have a different bandwidth and/or frequency range than the current RB allocation. A single RB may have a bandwidth of about 180 kHz, but other bandwidths may be used.

In one aspect, in order for the mobile communication device 110 to transmit data according to the upcoming RB allocation, the control unit 210 may select one of the first PLL/VCO 320 and the second PLL/VCO 330 that is not currently in use. The control unit 210 may tune the selected one of the first PLL/VCO 320 and the second PLL/VCO 330 to a target frequency based on a bandwidth of the upcoming RB allocation (e.g., number of allocated RBs).

For example, if the bandwidth of the upcoming RB allocation is narrow (e.g., number of allocated RBs less than or equal to a threshold x, where x may be equal to 6 or another integer value), the control unit 210 may tune the selected one of the first PLL/VCO 320 and the second PLL/VCO 330 to a frequency corresponding to the allocated RBs (e.g., center frequency of the allocated RBs).

In one exemplary aspect, the control unit 210 may determine the frequency corresponding to the upcoming RB allocation based on a lookup table (LUT). For example, the control unit 210 may determine, based on the LUT, the target frequency to tune the selected one of the first PLL/VCO 320 and the second PLL/VCO 330 in order for the mobile communication device 110 to transmit data in accordance with the upcoming RB allocation. In various aspects, the LUT may provide correlations between one or more RB allocations (e.g., in each frequency band) and target frequencies to tune each of the PLL/VCOs including, for example, but not limited to, the first PLL/VCO 320 and/or the second PLL/VCO 330.

Alternately, if the bandwidth of the upcoming RB allocation is not narrow (e.g., number of allocated RBs greater than x, where x may be equal to 6 or another integer value), the control unit 210 may tune the selected one of the first PLL/VCO 320 and the second PLL/VCO 330 to a frequency corresponding to an assigned channel (e.g., center frequency of assigned E-UTRA absolute radio frequency channel number (EARFCN)).

The control unit 210 may perform coarse tuning (CT) calibration on the selected one of the first PLL/VCO 320 and the second PLL/VCO 330 in order to achieve the target frequency (e.g., frequency corresponding to allocated RBs or to assigned EARFCN). In some aspects, the control unit 210 may perform CT calibration on the selected one of the first PLL/VCO 320 and the second PLL/VCO 330, and allow the selected one of the first PLL/VCO 320 and the second PLL/VCO 330 to settle to the target frequency. Alternately, in some aspects, the control unit 210 may perform CT calibration on the selected one of the first PLL/VCO 320 and the second PLL/VCO 330, and perform two-point modulation (TPM) to achieve the target frequency.

The PLL selector 340 may be configured to receive one or more control signals from the control unit 210. According to one exemplary aspect, the PLL selector 340 may select a frequency divided signal generated by the first PLL/VCO 320 and the first divider 325 or by the second PLL/VCO 330 and by the second divider 335 to output to the transmit path 300 based on the one or more control signals from the control unit 210. The control unit 210 may be configured to cause the PLL selector 340 to perform the switch while a first symbol (e.g., symbol #0) is transmitted by the mobile communication device 110 according to the upcoming RB allocation. Additionally, the switch may be performed during a transmission of a cyclic prefix (CP) of a symbol (e.g., symbol #0).

The transmit path 300 may include a digital to analog converter (DAC) 302 configured to receive a digital signal from the control unit 210 and to convert the digital signal into an analog signal. The transmit path 300 may further include a baseband filter (BBF) 304. The BBF 304 may be configured to receive the analog signal from the DAC 302. The BBF 304 may be further configured to receive one or more control signals from the control unit 210. Based on the one or more control signals from the control unit 210, the BBF 304 may be configured to modify a bandwidth of the analog signal received from the DAC 302 to produce a baseband signal (e.g., a filtered analog signal).

The transmit path 300 may include a mixer 306. The mixer 306 may be configured to modulate the frequency divided signal from the PLL selector 340 with the baseband signal from the BBF 304 to generate an up-converted signal. In some aspects, when the bandwidth of RB allocation is narrow (e.g., number of allocated RBs less or equal to x), the frequency divided signal from the PLL selector 340 may be at a frequency corresponding to the upcoming RB allocation (e.g., center frequency of upcoming RB allocation). Alternately, when the bandwidth of the RB allocation is not narrow (e.g., number of allocated RBs greater than x), the frequency divided signal from the PLL selector 340 may correspond to the assigned channel (e.g., center frequency of assigned EARFCN). The up-converted signal may have a frequency corresponding to the upcoming RB allocation (e.g., center frequency of upcoming RB allocation).

In various aspects, the BBF 304 may be configured to produce a baseband signal based on a specified frequency of the RB allocation and a tuned frequency of the frequency divided signal received at the transmit path 300 (e.g., from the PLL selector 340). For example, the frequency of the baseband signal generated by the BBF 304 may be adjusted such that modulating the baseband signal with the frequency divided signal generates an up-converted signal at the specified frequency of the upcoming RB allocation (e.g., center frequency of upcoming RB allocation).

The transmit path 300 may further include an amplifier (amp) 308. The amp 308 may be configured to amplify the up-converted signal from the mixer 306 for transmission.

The antenna 234 may receive the amplified signal from the amp 308 and transmit the amplified signal. For example, an amplified signal from the amp 308 may be transmitted to the communication network 120 (e.g., the first eNodeB 122 or the second eNodeB 124) on the subscription 115 via the antenna 234.

A person having ordinary skill in the art can appreciate that the RF module 232 may include additional and/or different components than shown in FIG. 3 without departing from the scope of the present disclosure. For example, although not shown, a person having ordinary skill in the art can appreciate that the RF module 232 may additionally include a receive path without departing from the scope of the present disclosure.

Figure 4A:
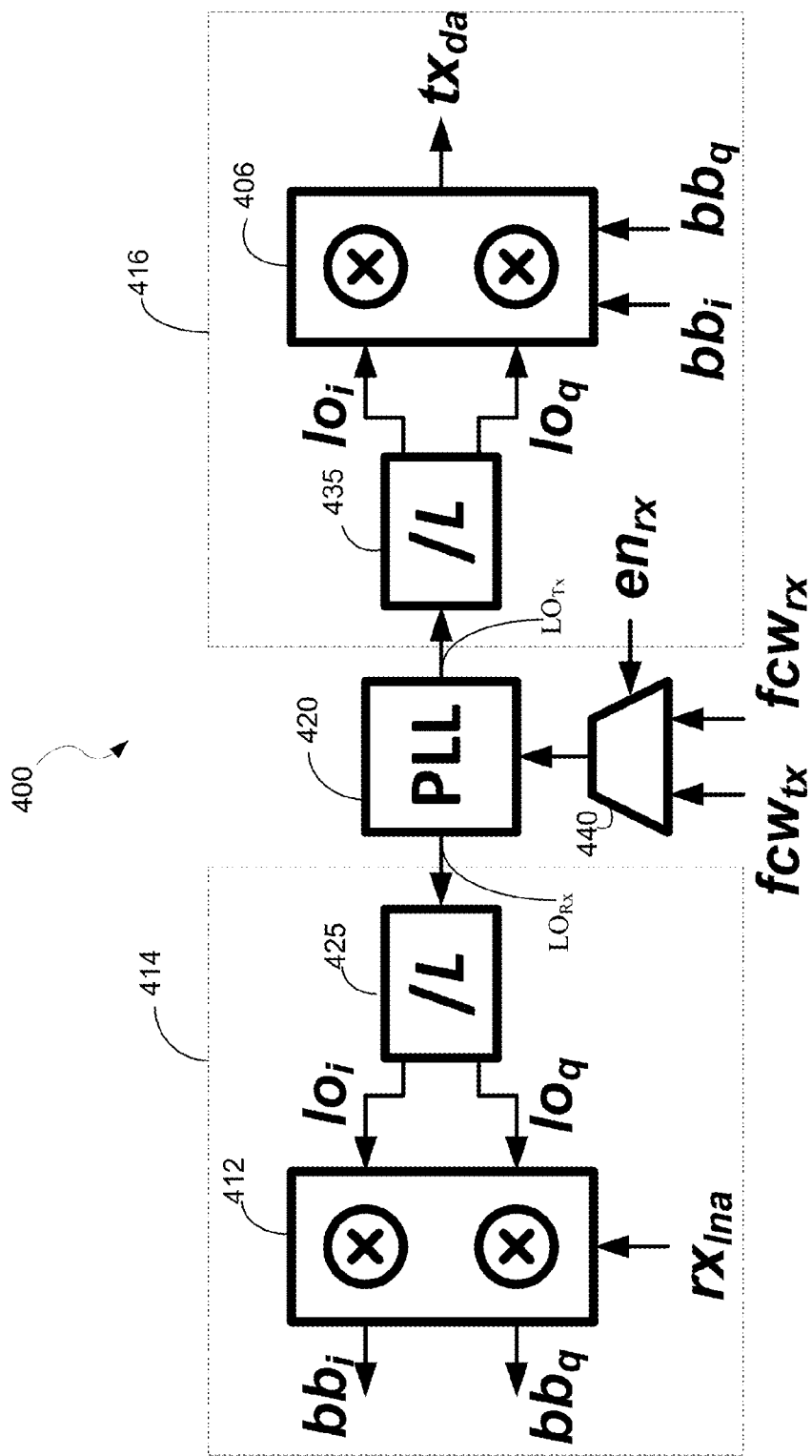
FIG. 4A is a block diagram illustrating a radio frequency (RF) device having a shared phase lock loop supporting both a receive mode of operation and a transmit mode of operation according to some aspects of the present disclosure.

FIG. 4A is a block diagram illustrating a radio frequency (RF) device 400 including a shared phase lock loop supporting both a receive mode of operation (using a receive chain) and a transmit mode of operation (using a transmit chain) according to some aspects of the present disclosure. The transmit mode of operation may correspond to a transmit path 416 including a local oscillator (LO) divider 435, and a first mixer 406. The receive mode of operation may correspond to a receive path 414 including a LO divider 425 (e.g., LO frequency divider), and a second mixer 412. The radio frequency device also includes a transceiver PLL 420 that is shared between the transmit path 416 and the receive path 414. A PLL controller (or PLL selector) 440 may be coupled to the transceiver PLL 420 to control the allocation of the transceiver PLL 420. For example, the transceiver PLL 420 may be allocated to the transmit path 416 when the radio frequency device 400 is transmitting a radio frequency signal or to the receive path 414 when the radio frequency device is receiving a radio frequency signal.

To allocate the transceiver PLL 420 to the receive path, an enable receive path signal, $en_{rx}$, may be provided to the PLL controller 440. The enable receive path signal, $en_{rx}$, may be disabled to allocate the transceiver PLL 420 to the transmit path. The receive path signal, $en_{rx}$, may be provided by a system controller (not shown) such as a radio frequency integrated circuit controller. The system controller may be coupled to the PLL controller 440 and may control a frequency of a transmitter local oscillator signal $LO_{Tx}$ and a receiver local oscillator signal $LO_{Rx}$ by frequency control words (FCW). FCW is a value input for obtaining an output frequency desired at the VCO. The FCW value may have an integer part and a fractional part. The frequency control words comprise a transmitter frequency control word ($fcw_{tx}$) for controlling the frequency of the transmitter local oscillator signal $LO_{Tx}$, and a receiver frequency control word ($fcw_{rx}$) for controlling the frequency of the receiver local oscillator signal $LO_{Rx}$.

The transceiver PLL 420 may be coupled with the LO frequency divider 435. The transceiver PLL 420 may output the transmitter local oscillator signal $LO_{Tx}$ to the LO frequency divider 435 during the transmit mode of operation. The LO frequency divider 435 may be configured to generate in-phase ($LO_{iTx}$) and quadrature ($LO_{qTx}$) LO signals with a 90 degree phase shift between them. The in-phase ($LO_{iTx}$) and quadrature ($LO_{qTx}$) LO signals are provided to the first mixer 406. A modulator (not shown) may generate in-phase samples and quadrature samples. For example, the in-phase and quadrature samples may be baseband samples such as an in-phase transmit baseband signal $bb_{iTx}$ and a quadrature transmit baseband signal $bb_{qTx}$. The in-phase transmit baseband signal $bb_{iTx}$ and the quadrature transmit baseband signal $bb_{qTx}$ are provided to the first mixer 406 along with the in-phase ($LO_{iTx}$) and quadrature ($LO_{qTx}$) LO signals. The first mixer 406 operates on the in-phase transmit baseband signal $bb_{iTx}$ and quadrature transmit baseband signal $bb_{qTx}$, and the in-phase ($LO_{iTx}$) and quadrature ($LO_{qTx}$) LO signals to generate a transmit radio frequency signal, $tx_{da}$.

The transceiver PLL 420 is also coupled with the LO frequency divider 425. The transceiver PLL 420 may output the receiver local oscillator signal $LO_{Rx}$ to the LO frequency divider 425 during the receive mode of operation. The LO frequency divider 425 may be configured to generate in-phase ($LO_{iRx}$) and quadrature ($LO_{qRx}$) LO signals with a 90 degree phase shift between them. The in-phase ($LO_{iRx}$) and quadrature ($LO_{qRx}$) LO signals are provided to the second mixer 412. A radio frequency signal received by the radio frequency device 400 is picked up by an antenna (e.g., antenna 234 of FIG. 2) and amplified by a low noise amplifier to generate an amplified radio frequency signal, $rx_{lna}$. The amplified radio frequency signal, $rx_{lna}$ is provided to the second mixer 412 along with the in-phase ($LO_{iRx}$) and quadrature ($LO_{qRx}$) LO signals. The second mixer 412 then generates baseband signals including an in-phase receive baseband signal $bb_{iRx}$ and a quadrature receive baseband signal $bb_{qRx}$ based on the amplified radio frequency signal, $rx_{lna}$ and the in-phase ($LO_{iRx}$) and quadrature ($LO_{qRx}$) LO signals.

Figure 4B:
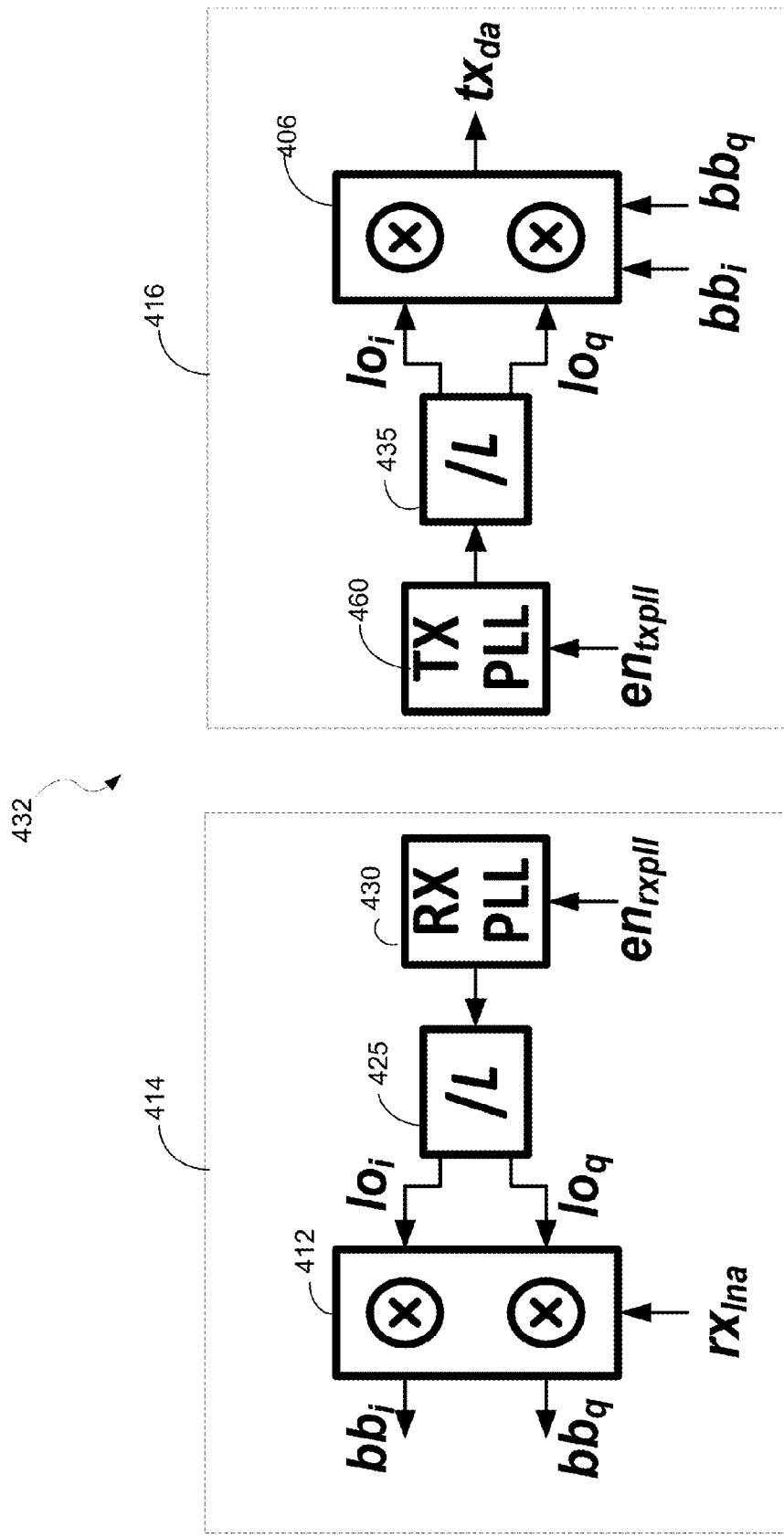
FIG. 4B is a block diagram illustrating a radio frequency (RF) device having separate phase lock loops supporting a receive mode and a transmit mode of communication according to some aspects of the present disclosure.

FIG. 4B is a block diagram illustrating a radio frequency (RF) device 432 illustrating separate phase lock loops supporting a receive mode and a transmit mode of communication according to some aspects of the present disclosure. The implementation illustrated by FIG. 4B is similar to that of FIG. 4A except that FIG. 4B uses separate PLLs. For example, a transmit PLL 460 is used for the transmit mode of operation and a receive PLL 430 is used for the receive mode of operation. The receive PLL 430 may be enabled by an enable receive path signal, $en_{rxLL}$, which may be provided to the receive PLL 430 by a system controller (not shown). The transmit PLL 460 may be enabled by an enable transmit path signal, $en_{txPLL}$, which may be provided to the transmit PLL 460 by the system controller.

Figure 5:
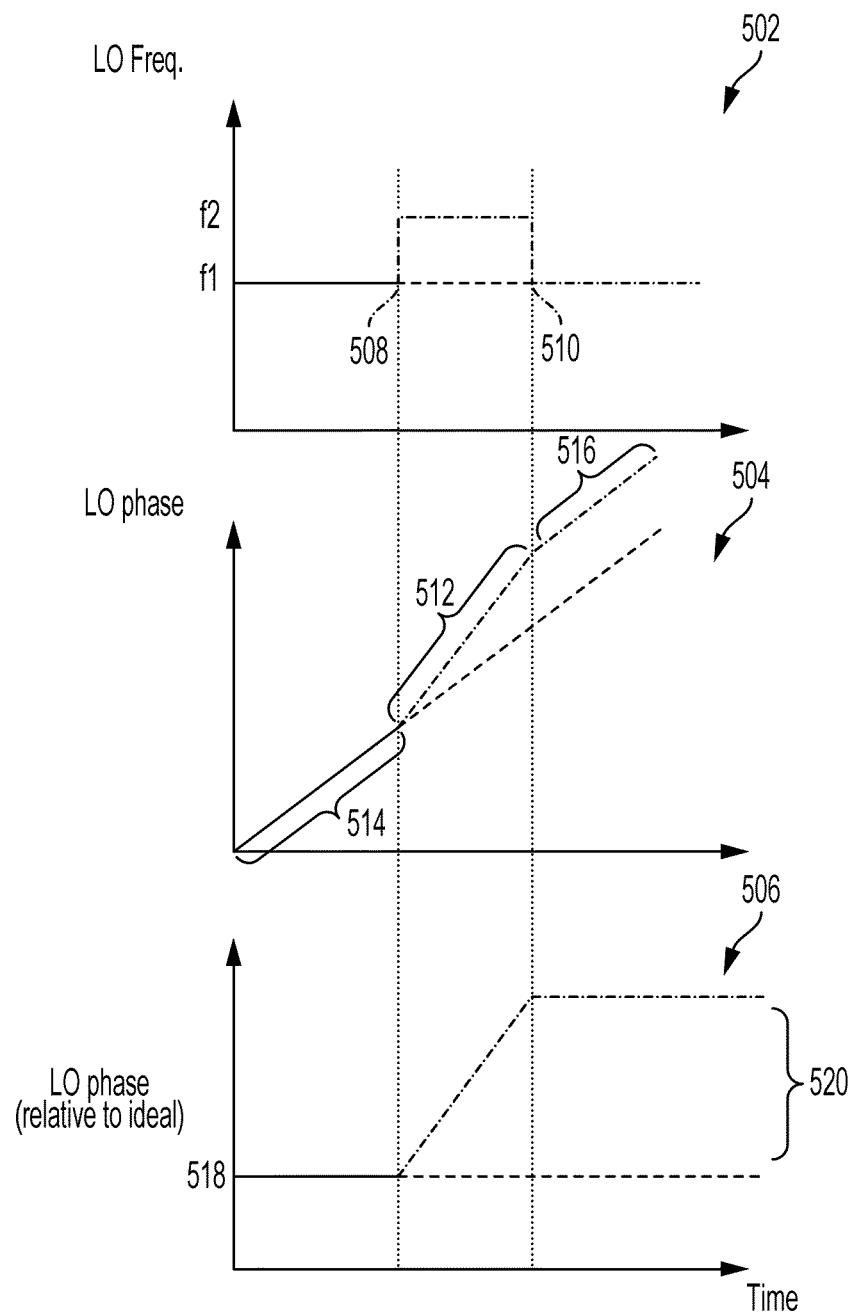
FIG. 5 illustrates local oscillator phase characteristics relative to an ideal phase according to aspects of the present disclosure.

FIG. 5 illustrates local oscillator phase characteristics relative to an ideal phase. A first graph 502 shows local oscillator frequency versus time. A second graph 504 shows local oscillator absolute phase versus time. A third graph 506 shows local oscillator phase relative to an ideal phase. Local oscillator phase uncertainty is introduced to a radio frequency device when a PLL changes frequency or shuts off.

The PLL may be subject to phase uncertainty when a single or shared PLL (e.g., transceiver PLL 420 as shown in FIG. 4A) is used by the radio frequency device for both the transmit mode of operation and the receive mode of operation. The PLL may be turned off by turning off a PLL frequency divider (/N). The PLL will lock to a different phase when turned on from an off position. Similarly, the PLL locks to a different phase when communication changes from receive to transmit and back to receive.

For example, when a frequency of a local oscillator (LO) of the PLL changes between the receive mode of operation (Rx) and the transmit mode of operation (Tx), the phase, which is an integral of the frequency, changes. The first graph 502 shows a frequency change from an initial frequency, f1, to a second frequency, f2. The change in frequency is shown between time 508 and time 510. After time 510, the frequency of the local oscillator returns back to its initial frequency, f1. When the frequency of the local oscillator is constant, as shown by the dashed lines in the first graph 502, the phase of the local oscillator is a perfect ramp, as shown by the dashed line of the second graph 504. However, when the frequency changes (e.g., from a lower receive frequency, f1, to a higher transmit frequency, f2), faster ramping of the phase occurs, as shown by the portion 512.

When the frequency of the local oscillator returns to the lower receive frequency, f1, the phase ramps up at the rate prior to the frequency change (as shown by the portion 514) and settles at a different phase ramp from the initial phase ramp of the lower receive frequency (as shown by the portion 516). For example, there is a discontinuity in the phase from an ideal position (e.g., for Rx). The discontinuity from the ideal position (e.g., indicated by line 518 in the third graph 506) is illustrated by the portion 520 of the third graph 506. The discontinuity of the phase is undesirable.

In some implementations, the phase discontinuity may be mitigated using a receive baseband phase rotator. However, this implementation involves changes to a modem. Therefore, a solution independent of the modem is desirable.

Figure 6:
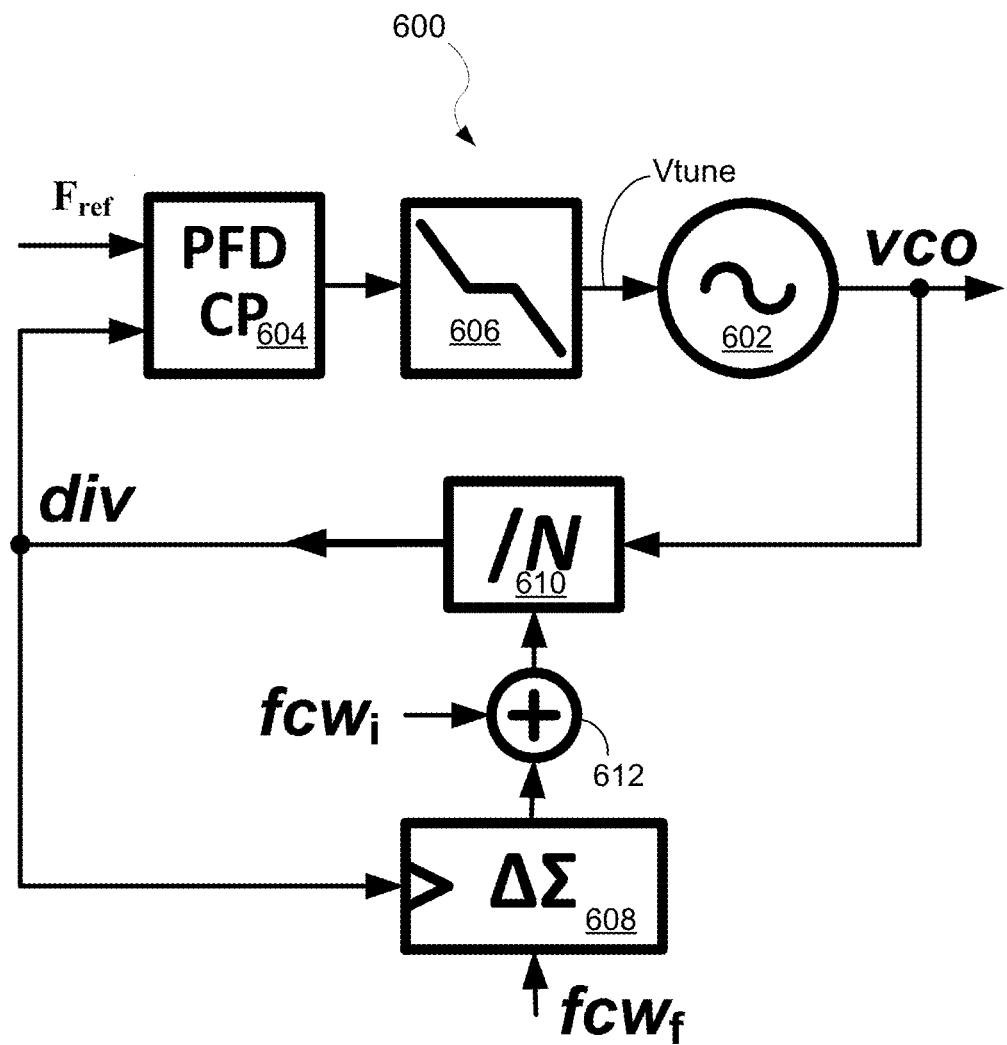
FIG. 6 illustrates a phase lock loop feedback system according to aspects of the present disclosure.

FIG. 6 illustrates a phase lock loop feedback system 600. The PLL feedback system 600 includes a PLL, which includes an oscillator such as a voltage controlled oscillator (VCO) 602, a phase detector 604, a loop filter 606 (e.g., low pass filter), and a PLL frequency divider 610 (e.g., integer-N synthesizer or fractional synthesizer). The other devices of the PLL feedback system 600 include a delta sigma modulator 608 and a combiner or summer 612. The oscillator may also be a temperature controlled oscillator (TCXO), a digitally controlled oscillator or any other crystal oscillator type. The PLL system may be integrated in a mobile communication device. For example, the PLL system may be implemented in a radio frequency (RF) device of the mobile communication device.

The phase detector 604 may be coupled to the loop filter 606, the loop filter may be coupled to the VCO 602, the VCO 602 may be coupled to the PLL frequency divider 610 and the PLL frequency divider 610 may be coupled to the phase detector 604 to form the feedback loop (closed loop). The output of the VCO 602 may be a frequency sinusoid that is controlled by a tuning voltage, Vtune, which is received by the VCO 602 from the loop filter. For example, changing the tuning voltage changes the frequency of the VCO 602. To synthesize a desirable or exact frequency of the VCO 602, the VCO 602 is included in the closed loop to feed back the VCO signal (or local oscillator signal) to the PLL frequency divider 610. The phase detector 604 may determine a phase difference between a reference frequency ($F_{ref}$) and an output of the PLL frequency divider 610 that is controlled by the delta sigma modulator 608 based on a frequency control word (fcw). The frequency control word is split into its integer, $fcw_i$, and fractional, $fcw_f$, parts. The combiner 612 combines signals corresponding to or based on the integer, $fcw_i$, and fractional, $fcw_f$, parts to create a fractional divider. The phase detector 604 compares an output (div) of the PLL frequency divider 610 with a reference signal ($F_{ref}$) generated by a local reference oscillator, such as a crystal oscillator or clock (not shown).

For example, if the reference frequency ($F_{ref}$) of the crystal oscillator is at 40 MHz and the output of the VCO 602 is at 4 GHz, the PLL frequency divider 610 receives the 4 GHz output of the VCO 602. The PLL frequency divider 610 is programmed to divide by 100 to provide an output frequency to the phase detector 604 that matches the reference frequency, $F_{ref}$, received at the phase detector 604. The phase detector 604 compares a phase of the reference frequency, $F_{ref}$, and the output frequency, div, of the PLL frequency divider 610 and generates an error signal proportional to a phase difference between the two frequencies. In some implementations, an analog multiplier or mixer can be used as a phase detector 604. Because the reference frequency, $F_{ref}$, and the output from the PLL frequency divider, div, are the same when the loop is locked, the output of the phase detector 604 contains a direct current (DC) component and a signal at twice the frequency. The DC component is proportional to the phase difference. The double frequency component is removed by the low pass filter 606 (the double frequency component is generated with mixer or multiplier based phase detectors). Any phase difference then shows up as a control voltage (e.g., tuning voltage (Vtune)) to the VCO 602 after filtering.

Figure 7:
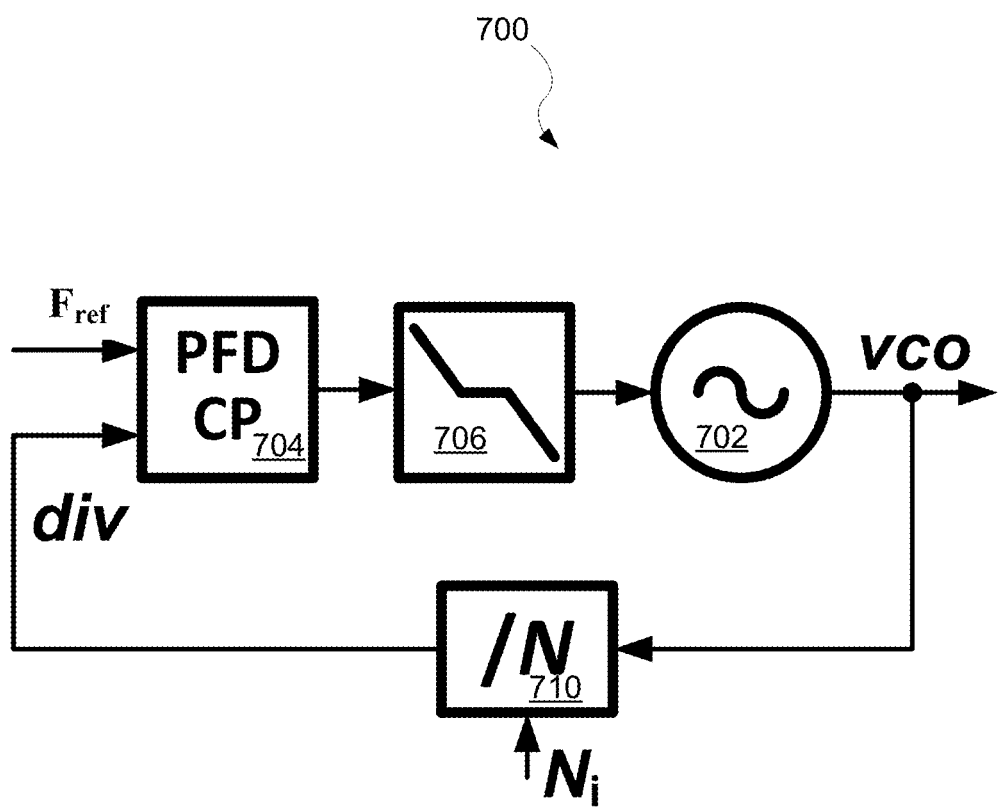
FIG. 7 illustrates an integer-N phase lock loop according to aspects of the present disclosure.
Figure 8:
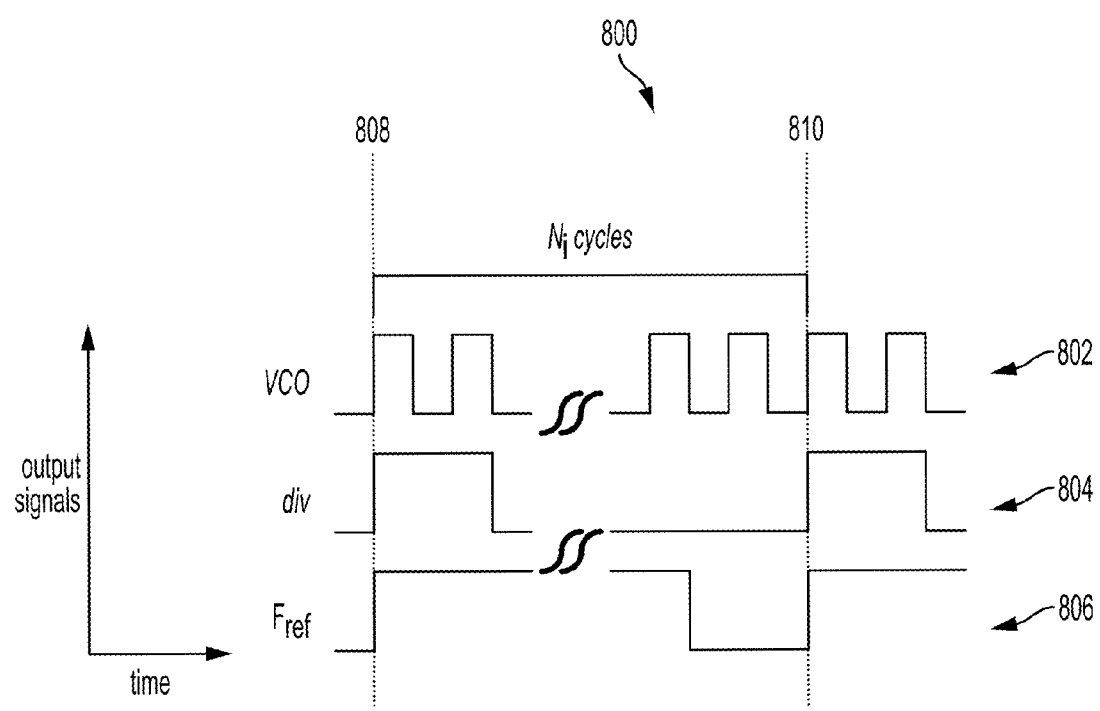
FIG. 8 is a timing diagram showing various output signals of the integer-N phase lock loop according to aspects of the present disclosure.
Figure 9:
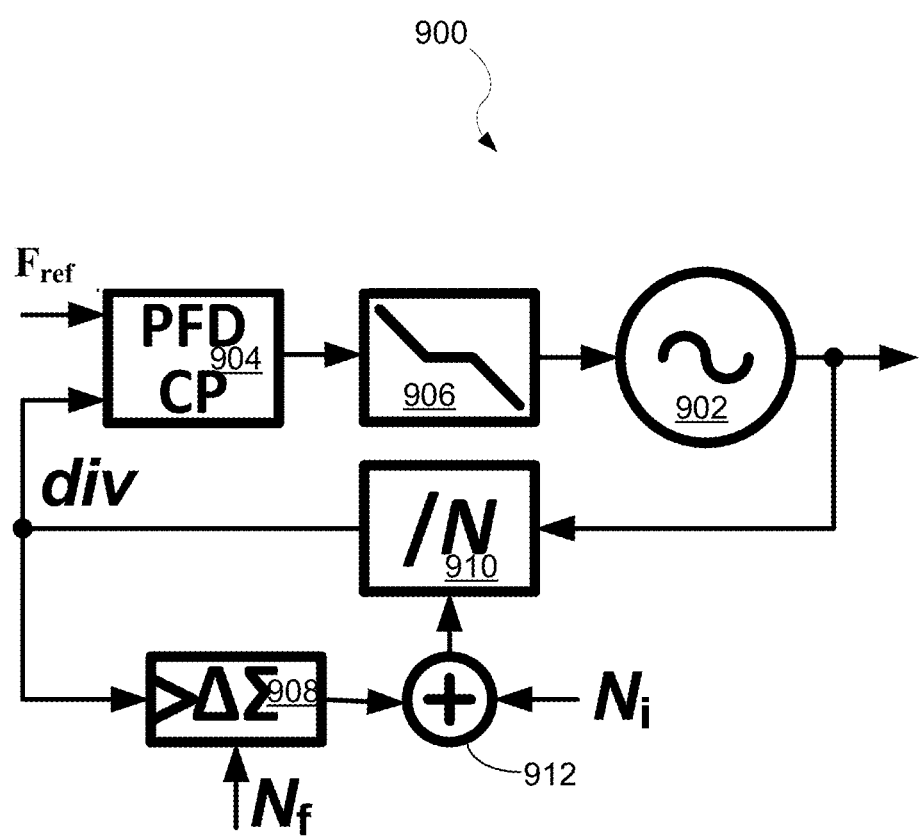
FIG. 9 illustrates a fractional-N phase lock loop according to aspects of the present disclosure.
Figure 10:
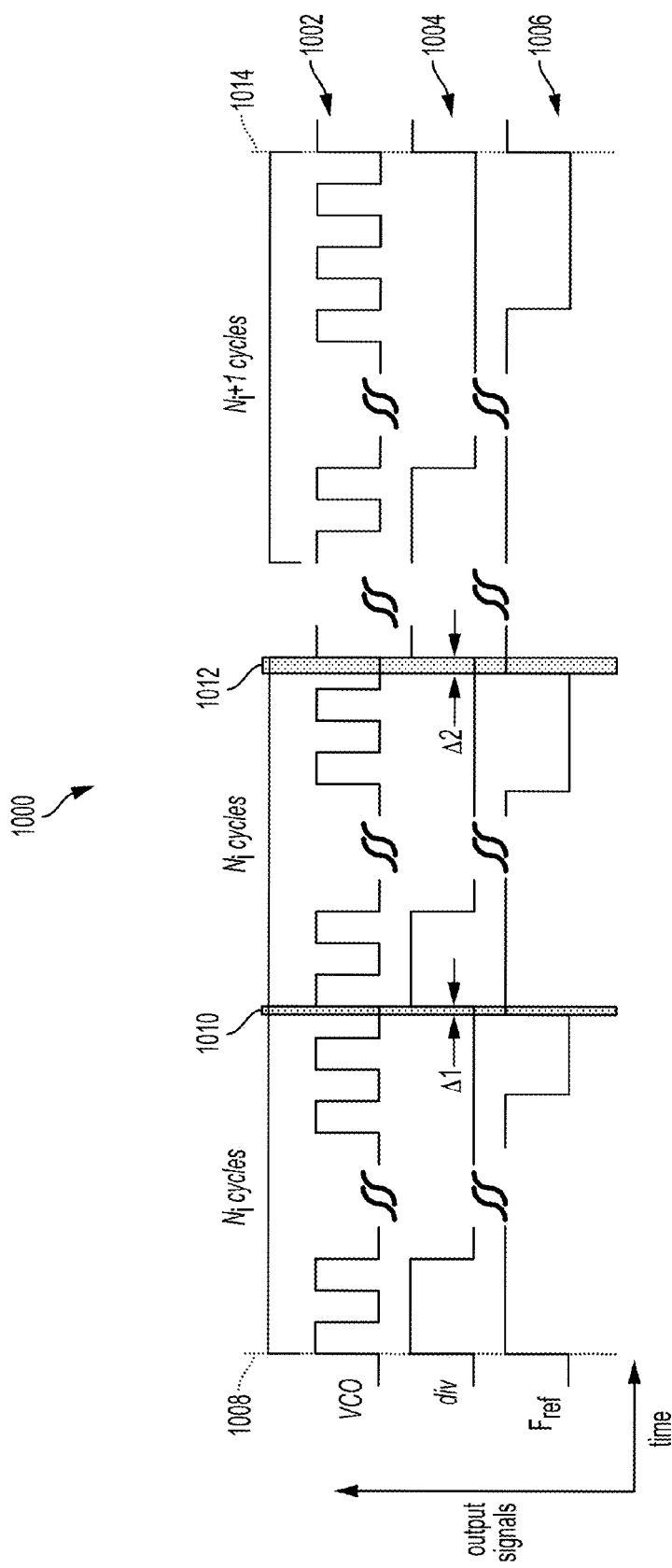
FIG. 10 is a timing diagram showing various output signals of the fractional-N phase lock loop according to aspects of the present disclosure.

Conventionally, the delta sigma modulator may be clocked by a signal from a PLL frequency divider. For example, in FIG. 6, the delta sigma modulator (DSM) 608 is clocked by the signal, div, from the PLL frequency divider 610. Accordingly, when the PLL, the PLL frequency divider 610 and/or the VCO 602 are powered down, there is no clock or power to the delta sigma modulator 608. Powering down the delta sigma modulator 608 causes the phase of the PLL (e.g., VCO phase) to be lost. Thus, when the delta sigma modulator 608 is powered back on, the phase of the VCO is at a different point. The VCO phase corresponds to a phase of a local oscillator (LO) signal that is output from the VCO 602. The phase of the VCO may be set based on an integer-N implementation as illustrated in FIGS. 7 and 8. Alternatively, the phase of the VCO may be set based on a fractional-N PLL implementation as illustrated in FIGS. 9 and 10.

FIG. 7 illustrates an integer-N phase lock loop 700. The integer-N phase lock loop 700 includes a voltage controlled oscillator (VCO) 702, a phase detector 704, a loop filter 706 (e.g., low pass filter), and an integer-N PLL frequency divider 710 (e.g., integer-N synthesizer). In the integer-N phase lock loop 700, the reference clock ($F_{ref}$) sets the phase of the VCO 702, as illustrated by the timing diagram in FIG. 8.

FIG. 8 is a timing diagram 800 of various output signals of the integer-N phase lock loop 700 of FIG. 7. In some aspects, the output signals (e.g., VCO, div, $F_{ref}$) are frequencies, although the output signals can be voltages or other representative signals. The timing diagram 800 includes the local oscillator (LO) signal 802 that is output (e.g., frequency) from the VCO 702 versus time. The timing diagram 800 also shows the output signal, div, 804 from the integer-N PLL frequency divider 710 versus time. The timing diagram 800 also shows the output signal, $F_{ref}$, 806 from the local reference oscillator (not shown) versus time. For illustrative purposes, the timing diagram 800 shows Ni cycles (where Ni is an integer) of the local oscillator (LO) signal that is output from the VCO 702. The VCO frequency is determined by a product of N (an integer) and the reference frequency, $F_{ref}$. The output signal from the VCO includes a phase and frequency component.

A rising edge of the reference, $F_{ref}$, is aligned with a rising edge of the output signal, div, from the integer-N PLL frequency divider 710, as shown at time 808 and time 810. This follows because the integer-N phase lock loop 700 locks to a rising edge of the reference, $F_{ref}$. For example, when the integer-N PLL frequency divider 710 is turned off and then on again or the frequency changes, the integer-N phase lock loop 700 locks to the rising edge of the reference, $F_{ref}$. Thus, the reference clock sets the VCO phase. Accordingly, there is no issue of phase continuity for the integer-N PLL.

FIG. 9 illustrates a fractional-N phase lock loop 900. The fractional-N phase lock loop 900 includes a voltage controlled oscillator (VCO) 902, a phase detector 904, a loop filter 906 (e.g., low pass filter), a delta sigma modulator 908, a combiner 912 and a PLL frequency divider 910 (e.g., fractional synthesizer). A fractional division of the PLL frequency divider 910 is obtained "on average" by toggling the PLL frequency divider 910, as illustrated by the timing diagram in FIG. 10.

FIG. 10 is a timing diagram 1000 of the various output signals of the fractional-N phase lock loop 900 of FIG. 9. In some aspects, the output signals (e.g., VCO, div, $F_{ref}$) are frequencies although the output signals can be voltages or other representative signals. The timing diagram 1000 shows the local oscillator (LO) signal 1002 that is output (e.g., frequency) from the VCO 902 versus time. The timing diagram 1000 also shows the output signal, div, 1004 from the PLL frequency divider 910 versus time. The timing diagram 1000 also shows the output signal, $F_{ref}$, 1006 from the local reference oscillator (not shown) versus time.

The PLL frequency divider 910 (/N) of the fractional-N phase lock loop 900 toggles between different division factors to obtain, on average, a fractional frequency. The phase difference between the reference frequency, $F_{ref}$, and divisional frequency, div, is not zero at each phase comparison but follows a deterministic pattern that is zero on average. For example, at time 1010, a phase difference corresponding to the difference Δ1 exists between the reference frequency, $F_{ref}$, and divisional frequency, div. Similarly, at time 1012, a phase difference corresponding to the difference Δ2 exists between the reference frequency, $F_{ref}$, and divisional frequency, div.

A local oscillator (LO) signal that is output from the VCO 902 (e.g., VCO frequency) that is equal to (N+a fractional number (e.g., 0.5)) multiplied by the reference frequency may be obtained for the fractional PLL. The divider feature is obtained by controlling a modulus (the frequency division factor from the PLL frequency divider) and toggling it between, for example, N and N+1. The delta sigma modulator 908 is the fractional part of the fractional-N PLL frequency divider 910.

To generate a fractional frequency or to create a fractional divider, the delta sigma modulator 908 dynamically changes from N to N+1 one out of every selected reference number of cycles. For example, to generate a fraction, the delta sigma modulator 908 generates a stream of "0s" and "1s," which when averaged provides a desired fractional number (e.g., 0.5). The string of "0s" and "1s" are combined with a string of N at the combiner 912. The combiner 612 of FIG. 6 combines signals corresponding to or based on the integer, $fcw_i$, and fractional, $fcw_f$, parts of a frequency code word, fcw, to create a fractional divider. The frequency code words may be replaced with parameters Ni corresponding to the integer number cycles or parameters Nf for creating the fractional divider. It is worth noting that Ni and N both represent integers. Ni is used to differentiate from a parameter Nf that represents a fractional part of the cycles.

For example, the fractional divider may correspond to a division given by the function (N*9+N+1)/10 on average (in this case the selected reference number of cycles=10). Here, the delta sigma modulator 908 generates a string of "0" nine times out of ten and a "1" one time out of ten referenced number of cycles to generate the desirable fractional number.

As illustrated in the timing diagram 1000, after the initial rising edges of the reference frequency, $F_{ref}$, and the output signal, div, from the PLL frequency divider 910 at time 1008, a rising edge of the reference frequency, $F_{ref}$, is not aligned with the rising edge of the output signal, div, until the N+1 occurrence at the selected reference number of cycles, as shown at time 1014. In some implementations, it is desirable to divide by N+0.5 to maintain phase continuity, for example, at the output of the VCO 902. However, because the delta sigma modulator (e.g., delta sigma modulator 908) is digital and generates "0" and "1," the stream of "0s" and "1s" is generated and averaged to obtain the fractional number of 0.5.

According to the fractional-N implementation, a phase error continues to be accumulated between the reference frequency, $F_{ref}$, and the output signal, div, until the control from the delta sigma modulator 908 changes by 1 to align the reference frequency, $F_{ref}$, and the output signal, div. Accordingly, at steady state, the rising edge of the output signal, div, follows a periodic pattern around the rising edge of the reference frequency, $F_{ref}$. The pattern is deterministic and is set by the delta sigma modulator 908. The VCO rising edge position (phase) of the PLL depends on both the phase of the reference frequency, $F_{ref}$, and information stored in the delta sigma modulator.

Figure 11:
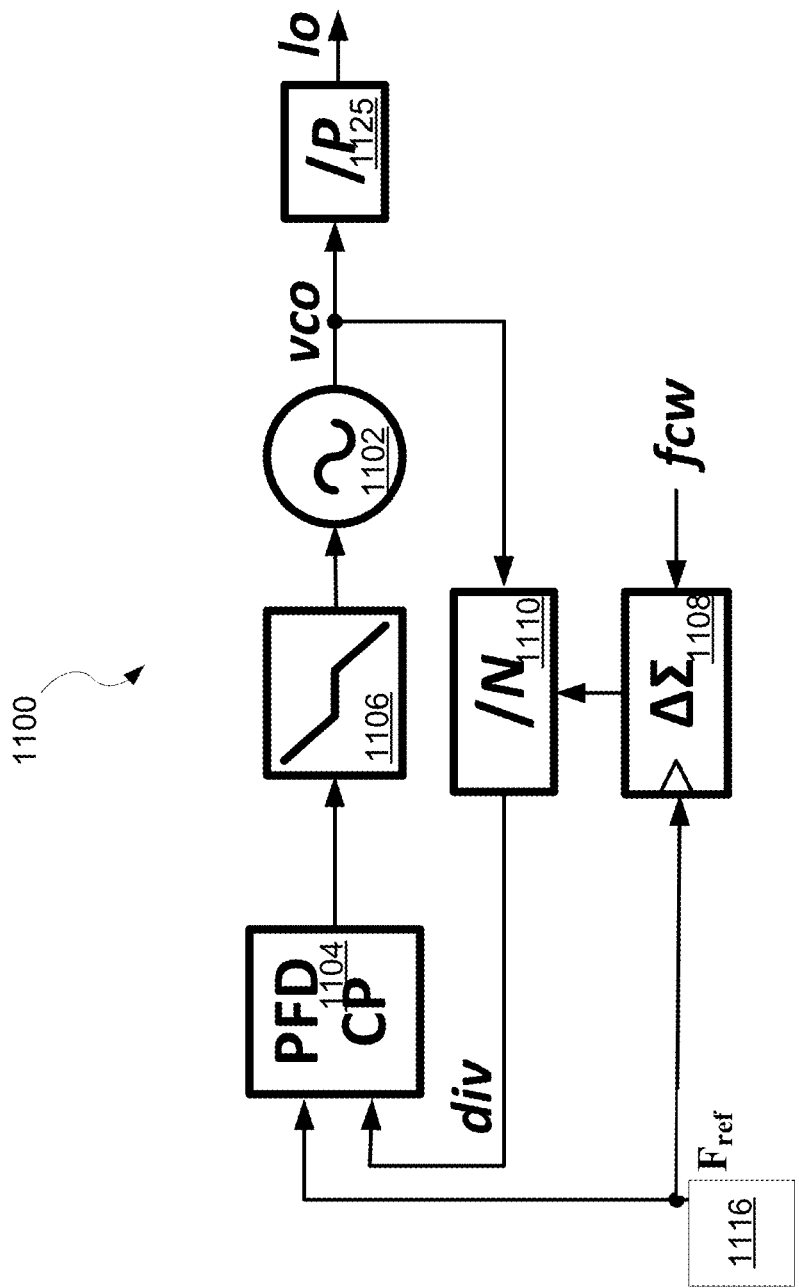
FIG. 11 is a timing diagram of a phase lock loop (PLL) system illustrating phase continuity according to aspects of the present disclosure.

FIG. 11 is a phase lock loop (PLL) system 1100 illustrating phase continuity according to aspects of the present disclosure. A PLL of the PLL system 1100 may include a VCO 1102, a phase detector 1104, a loop filter 1106, and a PLL frequency divider 1110. The PLL system 1100 includes the PLL and a delta sigma modulator 1108. In some implementations, the delta sigma modulator may be integrated into a PLL of the PLL system 1100. Alternatively, one or more portions of the delta sigma modulator may be external to but coupled to the PLL. The VCO 1102, the phase detector 1104, the loop filter 1106, the delta sigma modulator 1108 and the PLL frequency divider 1110 of FIG. 11 are similar to, for example, the VCO 602, the phase detector 604, the loop filter 606, the delta sigma modulator 608 and the PLL frequency divider 610 of FIG. 6.

The PLL of the PLL system 1100 may be coupled to a local oscillator (LO) frequency divider 1125. For example, the LO frequency divider 1125 may be coupled to the VCO 1102 to receive a LO signal that is output from the VCO 1102. The PLL of the PLL system 1100 may receive a reference signal having a reference frequency $F_{ref}$ from a reference signal source device 1116. The reference signal source device 1116 may be a control unit (e.g., control unit 210) or reference signal generating source such as a crystal or reference clock. In some aspects, the control unit may cause the crystal to generate the reference frequency. The reference signal $F_{ref}$ is provided to both the phase detector 1104 and the delta sigma modulator 1108 to maintain phase continuity of the PLL when portions of the PLL and related devices are turned off or powered down. By directly/indirectly connecting the delta sigma modulator 1108 to the reference signal source device 1116, the control or power to the delta sigma modulator 1108 is maintained independently from other devices of the PLL system 1100. For example, one or more portions of the delta sigma modulator 1108 are clocked with the reference clock for the PLL when the PLL is turned off to maintain phase continuity while the PLL is off.

The reference signal $F_{ref}$ received by the PLL is processed by the PLL to generate the local oscillator (LO) signal that is output from the VCO 1102 to the LO frequency divider 1125. The combination of the PLL and the LO frequency divider 1125 may be configured to generate and output a signal that is synchronized to the phase and the frequency of the reference signal, $F_{ref}$.

To achieve phase continuity at the output of the LO frequency divider, the phase of the PLL is sampled at the LO frequency divider and fed back to the PLL. For example, feedback is sent from an output of the LO frequency divider to the first PLL (e.g., receive PLL) to correct a phase at the output of the LO frequency divider. Even when the output of the VCO achieves phase continuity, the local oscillator (LO) phase may be subject to uncertainty. For example, with a divide by two frequency divider, the local oscillator phase may be subject to 180 degree uncertainty. The phase of the local oscillator may be detected at the output of the LO frequency divider. The phase of the local oscillator (LO) may be detected and restored through the PLL. A phase detection and correction implementation is illustrated by the PLL of FIG. 12 and the timing diagram of FIG. 13.

Figure 12:
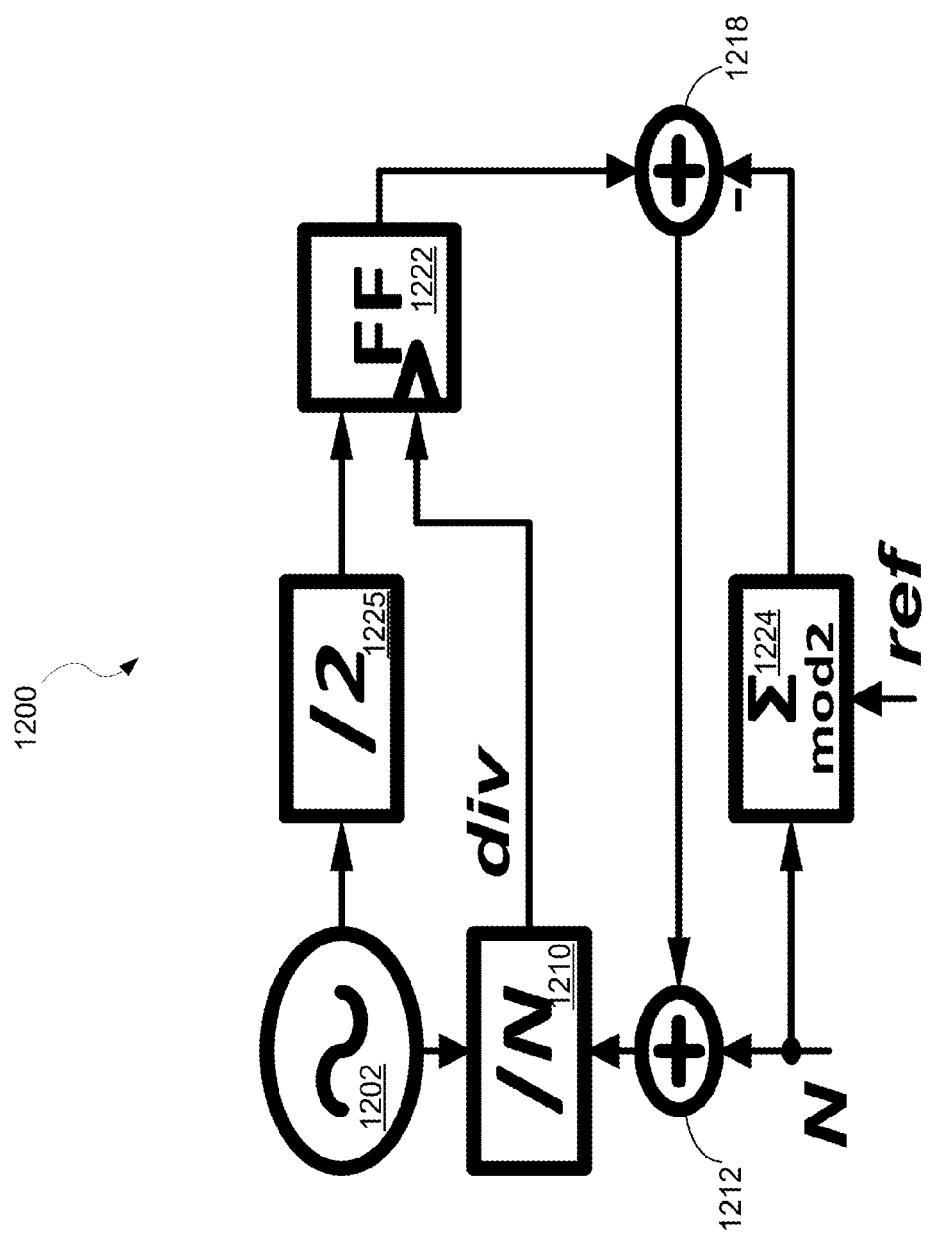
FIG. 12 is a phase lock loop (PLL) feedback system for implementing phase detection and correction according to aspects of the present disclosure.

FIG. 12 is a PLL feedback system 1200 for implementing phase detection and correction according to aspects of the present disclosure. The PLL feedback system 1200 includes a PLL that is partially shown, a local oscillator (LO) frequency divider 1225 (e.g., divide by two local oscillator (LO) dividers) a first combiner 1212, an accumulator 1224, a second combiner 1218 (e.g., adder) and a phase controller such as a flip flop 1222 or multiple flip-flops. For example, the partially shown PLL includes the PLL frequency divider 1210 and the VCO 1202. An output of the VCO 1202 is provided to the PLL frequency divider 1210. The PLL generates a signal (e.g., div) at an output of the PLL frequency divider 1210. The LO frequency divider 1225 and the PLL frequency divider 1210 operate in parallel.

The output of the PLL frequency divider 1210 is provided to a phase detector (not shown) and a low pass filter (not shown) of the PLL, for example, and controls the VCO 1202. An output of the LO frequency divider 1225 is provided to the flip flop 1222. A phase of the PLL (e.g., a phase of the output of the VCO 1202) is sampled at the LO frequency divider 1225 and fed back to the PLL. The LO frequency divider 1225 is coupled to the PLL and configured to receive the output of the PLL. The flip flop may be a simple phase detector. For example, the flip flop 1222 samples the output of the LO frequency divider 1225 using the signal, div, at the output of the PLL frequency divider 1210 for a clock input, and outputs the result as phase information to the combiner 1218.

Figure 13:
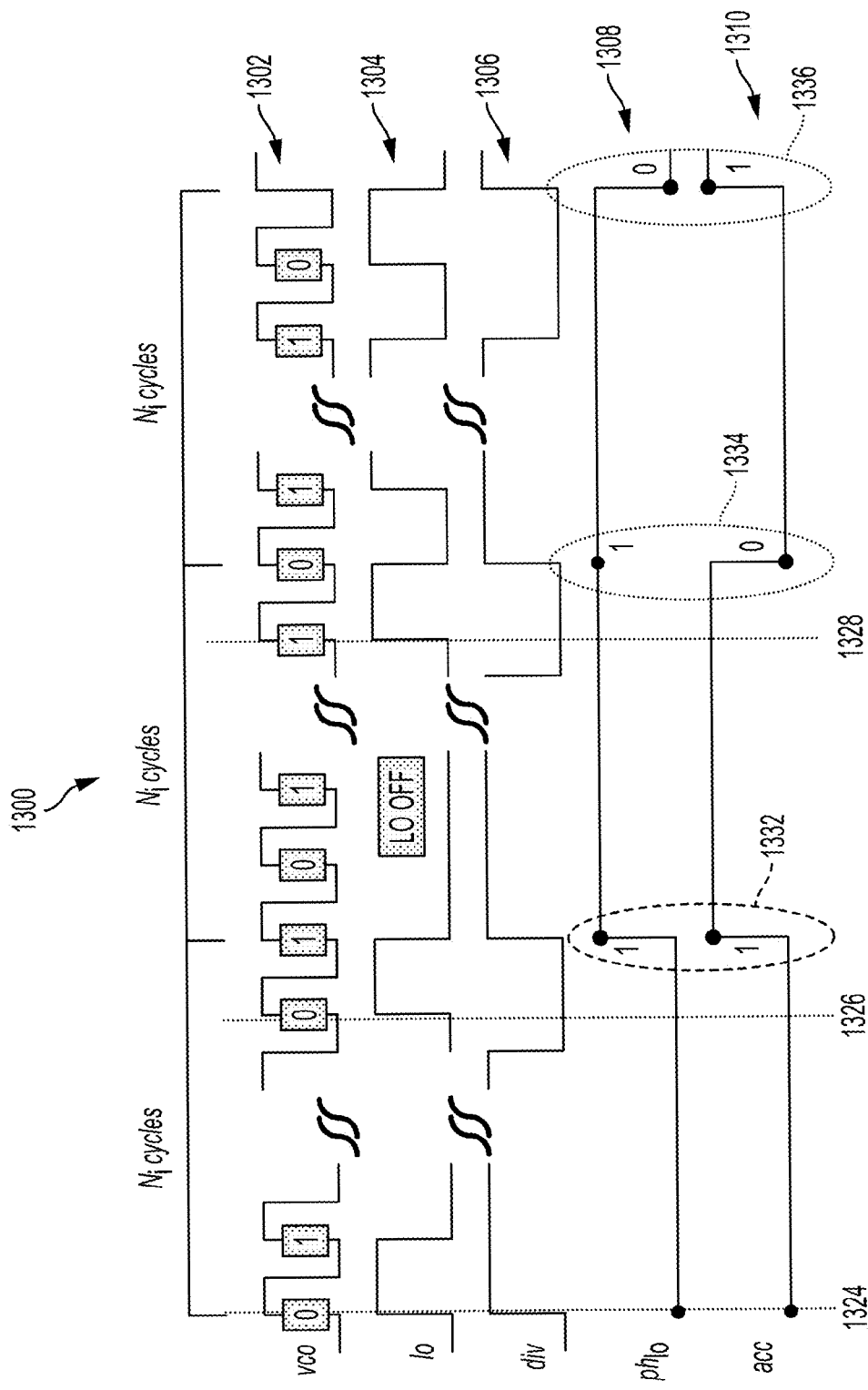
FIG. 13 is a timing diagram showing various output signals of a phase look loop feedback system according to aspects of the present disclosure.

FIG. 13 is a timing diagram 1300 of various output signals of the phase lock loop feedback system 1200 of FIG. 12. The timing diagram 1300 shows five signals 1302, 1304, 1306, 1308, and 1310. A frequency of the output of the VCO 1302 is shown versus time. A frequency of the output of the LO frequency divider 1304 versus time is shown. A frequency of the signal, div, 1306 is shown at the output of the PLL frequency divider 1210. A phase sample output, $ph_{lo}$, 1308 of the flip flop 1222 is shown. The phase sample output corresponds to a phase of the output of the LO frequency divider 1225. A signal, acc, 1310 at the output of the accumulator 1224 is also shown.

The output of the VCO 1202 may have continuous phase (e.g., there is no interruption or discontinuity in the output of the VCO). In some implementations, the output (LO) of the LO frequency divider 1225 has a rising edge aligned with a rising edge of the output of the VCO 1202. For example, the rising edge of the output of the LO frequency divider 1225 may be aligned with the rising edge of the output of the VCO 1202 that corresponds to binary "0." This alignment of the rising edges of the output of the LO frequency divider 1225 and the output of the VCO 1202 is illustrated at times 1324 and 1326 of the timing diagram 1300.

However, when the LO frequency divider 1225 is turned off and then turned on again (causing discontinuity in the output of the LO frequency divider 1225), the rising edge of the output of the LO frequency divider 1225 is no longer aligned with the rising edge of the output of the VCO 1202 that corresponds to binary "0." Instead, the rising edge of the output of the LO frequency divider 1225 is aligned with the rising edge of the output of the VCO 1202 that corresponds to binary "1," as illustrated at time 1328 of the timing diagram 1300. As a result of the change in alignment, there is phase discontinuity in the output of the LO frequency divider 1225. Therefore, uncertainty arises in the phase of the output of the LO frequency divider 1225.

The phase of the output of the LO frequency divider 1225 may be detected and restored through the PLL feedback system (e.g., PLL feedback system 1200) according to aspects of the present disclosure. In some implementations, there are $N_i$ cycles (e.g., the integer i from $N_i$ is a predefined number) for the VCO 1202 between a first rising edge of the signal, div, to a second rising edge of the signal, div. Ni may be an integer part while Nf may be a fractional part. The number of VCO cycles between two consecutive rising edges of the output signal, div, of the PLL frequency divider 1210 is $N_i$ (the PLL frequency divider is to divided by $N_i$). To simplify the time waveforms in FIG. 13, the time waveforms are illustrated in accordance with an integer N PLL implementation. For example, in this case the PLL is configured as an integer one with FCW=$N_i$, integer number. However, for a fractional-N PLL, N cycles of the VCO exist between two rising edges of div, where N is equal to $N_i$+n and n is the output of the delta-sigma modulator (e.g., delta sigma modulator 1108).

Consider, N, an odd number (e.g., 5), and a PLL (e.g., an integer-N PLL), where N is consistently the same, is being adopted and the frequency of the VCO 1202 is, for example, 5*reference frequency ($F_{ref}$). A first rising edge of the output of the PLL frequency divider 1210 is aligned with the rising edge of the output of the VCO 1202 output that corresponds to binary "0." The next consecutive rising edge of the output of the PLL frequency divider 1210 is aligned with the rising edge of the output of the VCO that corresponds to binary "1," and so on. Alternatively, if $N_i$ is an even number, the two consecutive rising edges of the PLL frequency divider 1210 may correspond to a same binary number with respect to the output of the VCO 1202.

In some implementations, the accumulator 1224 coupled to the partially shown PLL accumulates the frequency control mode (N or Ni) of the PLL frequency divider 1210. If N is an odd number, then the output, acc, of the accumulator 1224 is 0, 1, 0, 1, etc. (e.g., if N=5, 5 modulo 2=1, the next is 0 because 10 modulo 2=0, the next is 1 because 15 mod 2=1 and so on) or keeps accumulating 1 and 0. If the phase of the output of the LO frequency divider 1225 is maintained, the signal, acc, at the output of the accumulator 1224 is aligned with the phase sample output, $ph_{lo}$, of the flip flop 1222, as shown in region 1332. In region 1332, the rising edge of acc corresponds to a "1" and is aligned with a rising edge of $ph_{lo}$, which also corresponds to a "1."

However, the signal, acc, at the output of the accumulator 1224 is not aligned with the phase sample output, $ph_{lo}$, when there is discontinuity in the output of the LO frequency divider 1225. For example, the output of the LO frequency divider 1225 is discontinuous when the LO frequency divider 1225 is turned off (LO off) and then turned on. The discontinuity is illustrated in regions 1334 and 1336. For example in region 1334, $ph_{lo}$ is maintained at "1" and is therefore is not aligned with a falling edge of acc, which corresponds to a "0." In region 1336, a rising edge of acc corresponds to a "1" and therefore is not aligned with a falling edge of $ph_{lo}$, which corresponds to a "0."

Looking at the signal, acc, at the output of the accumulator 1224, and sampling the output of the LO frequency divider 1225 with the output signal, div, of the PLL frequency divider 1210, at the flip flop 1222, an error in the local oscillator phase (e.g., phase of the output of the LO frequency divider 1225 or phase of the output of the flip flop 1222) can be estimated. For example, the phase sample output, $ph_{lo}$, of the flip flop 1222 is compared (at adder 1218) to a predicted phase of the output of the LO frequency divider 1225 and the output of the adder 1218 is fed back to the PLL frequency divider 1210. In one aspect of the disclosure, the predicted phase (e.g., a deterministic predicted phase) of the output of the LO frequency divider 1225 corresponds to the signal, acc, at the output of the accumulator 1224. In some implementations, the predicted phase of the output of the flip flop 1222 corresponds to the signal, acc, at the output of the accumulator 1224. This implementation may be performed during the receive mode of operation.

The sampling at the flip flop (e.g., flip flop 1222) is subject to challenges stemming from the fact that the signals received at the flip flop are from different portions of a chip or device. The VCO (e.g., VCO 1202) and the PLL frequency divider (e.g., PLL frequency divider 1210) are close to each other. However, the LO frequency divider (e.g., LO frequency divider 1225) may be further away (e.g., 1 mm) from the VCO (e.g., VCO 1202). As a result, the propagation delay of the output signal, div, of the PLL frequency divider 1210 and the output of the LO frequency divider 1225 at the flip flop are different.

Sampling the two signals with the two different propagation delays at the flip flop may be subject to meta-stability. The data should be stable before performing the sampling to prevent the effects of meta-stability. In the meta-stable state, the output of the flip flop is uncorrelated to the input. To mitigate the meta-stability of the flip flop, calibration may be performed prior to the sampling. An example calibration includes delaying the output signal, div, of the PLL frequency divider 1210 and/or the output of the LO frequency divider 1225 (using one or more delay devices) prior to the flip flop to mitigate the propagation delay.

Other implementations for maintaining phase continuity and detecting phase error are also contemplated. These implementations introduce a control feedback system for controlling a frequency and/or phase of the PLL.

Figure 14:
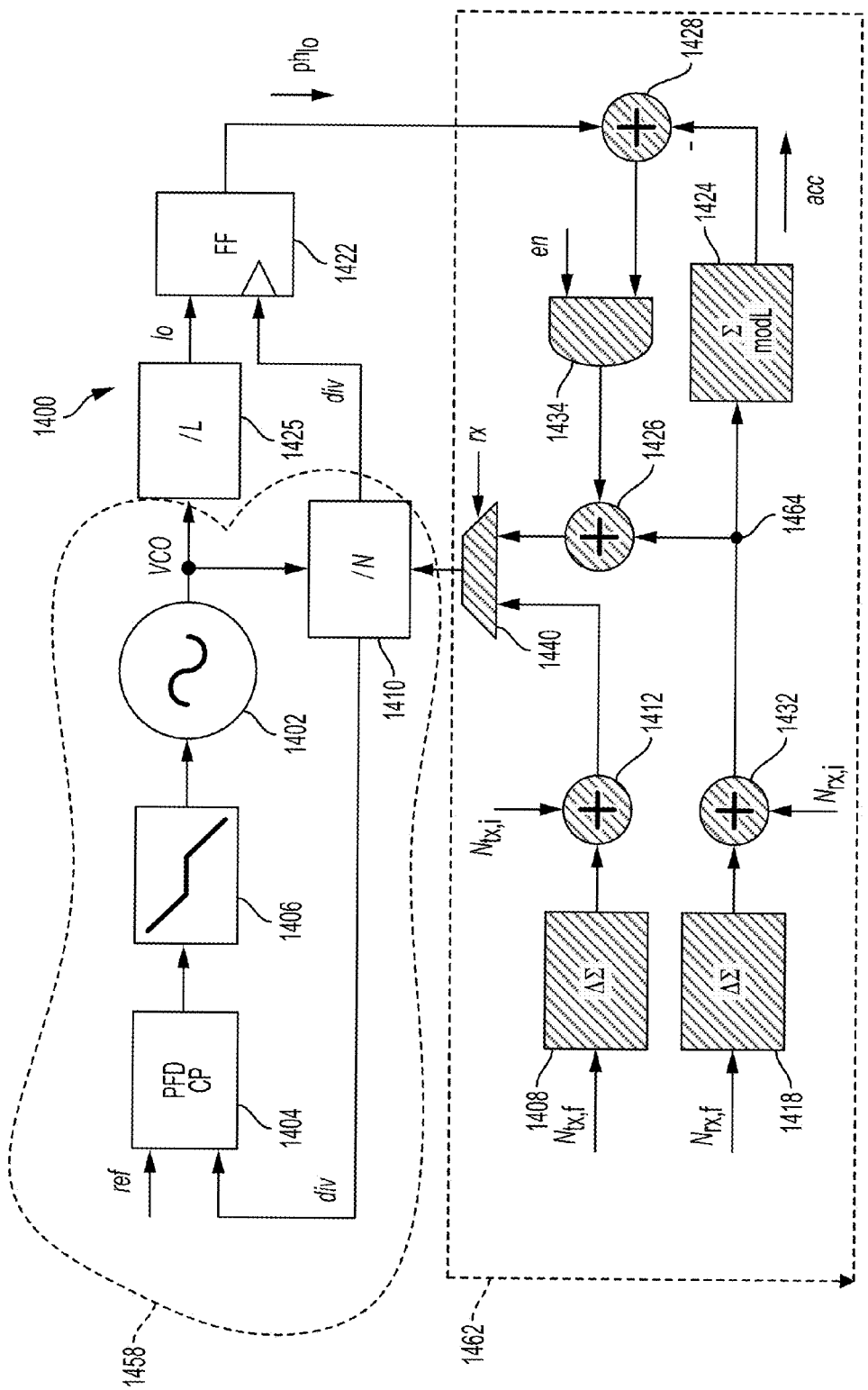
FIG. 14 is a block diagram illustrating a phase lock loop system including separate delta sigma modulators for supporting a receive mode and a transmit mode of communication according to some aspects of the present disclosure.

FIG. 14 is a block diagram illustrating a phase lock loop (PLL) system 1400 including separate delta sigma modulators for supporting a receive mode and a transmit mode of communication according to some aspects of the present disclosure. The PLL system 1400 includes a VCO 1402, a phase detector 1404, a loop filter 1406, a first delta sigma modulator 1418, a second delta sigma modulator 1408, a selector 1440 (e.g., a delta sigma selector), a PLL frequency divider 1410, a LO frequency divider 1425, a first combiner 1412, a second combiner 1426, a third combiner 1428, a fourth combiner 1432, an accumulator 1424, a logic gate 1434 (e.g., AND gate) and a flip flop 1422. In some implementations, a PLL 1458 of the PLL system 1400 includes the VCO 1402, the phase detector 1404, the loop filter 1406, and the PLL frequency divider 1410. However, all or portions of other devices of the PLL system 1400 may be integrated in the PLL 1458. The PLL system 1400 in this case includes a single PLL 1458.

A frequency (and/or phase) of the PLL 1458 may be controlled based on whether the PLL system 1400 is operating according to a receive mode of operation or a transmit mode of operation. A control feedback system 1462 may be introduced to control the frequency of the PLL 1458. For example, the control feedback system 1462 may provide control signals to the PLL frequency divider 1410 to control the frequency (and/or phase) of the PLL 1458.

In some aspects of the control feedback system 1462, the first delta sigma modulator 1418 is included in a receive chain and the second delta sigma modulator 1408 is included in a transmit chain. Control of the first delta sigma modulator 1418 may be provided by a receiver and the control of the second delta sigma modulator 1408 may be provided by a transmitter. For example, a first frequency control signal (e.g., $N_{tx,f}$) may be provided by or to the transmitter and a second frequency control signal (e.g., $N_{rx,f}$) may be provided by or to the receiver to control the first delta sigma modulator 1418 and the second delta sigma modulator 1408. The first frequency control signal (e.g., $N_{tx,f}$) and the second frequency control signal (e.g., $N_{rx,f}$) may be based on a fractional part to create a fractional frequency divider.

A third frequency control signal (e.g., $N_{tx,i}$) may be provided by the transmitter or to the transmitter and a second frequency control signal (e.g., $N_{rx,i}$) may be provided by the receiver or to the receiver to control the PLL frequency divider 1410. The third frequency control signal (e.g., $N_{tx,i}$) and the fourth frequency control signal (e.g., $N_{rx,i}$) may be based on an integer part of a frequency control signal to be respectively used in conjunction with an output from the first delta sigma modulator 1418 and an output of the second delta sigma modulator 1408 to create the fractional frequency divider.

When the PLL 1458 is operating in accordance with a transmit mode of operation, portions of the receive chain may be turned off. To maintain phase continuity, power is maintained at the first delta sigma modulator 1418 and/or the second delta sigma modulator 1408 even when the PLL 1458 is powered down or the LO frequency divider 1425 is powered down. For example, the first delta sigma modulator 1418 and/or the second delta sigma modulator 1408 are always clocked (e.g., by the reference frequency $F_{ref}$, which stays on) even when the PLL 1458 is off to maintain phase continuity.

Thus, to maintain a receive phase when switching from reception to transmission where the transmission frequency is different from the reception frequency, a dedicated delta sigma modulator (e.g., the first delta sigma modulator 1418) is selected to maintain the phase of the PLL with respect to the reception. For example, the dedicated delta sigma modulator for reception is kept on by clocking the first delta sigma modulator 1418 by the reference frequency $F_{ref}$ to maintain the phase of the PLL.

The combiner 1412 combines the output of the second delta sigma modulator 1408 and the third frequency control signal (e.g., $N_{tx,i}$) and provides the result for the selector 1440. The selector 1440 is introduced to switch between the first delta sigma modulator 1418 and the second delta sigma modulator 1408 depending on whether a reception (receive mode) or transmission (transmit mode) is specified or occurring. The output of the selector 1440 is then provided to the PLL frequency divider 1410.

An enable/disable signal (e.g., rx) is provided to the selector 1440 to cause the selector to select the transmit path. The selector 1440 provides the combined result of the output of the second delta sigma modulator 1408 and the third frequency control signal (e.g., $N_{tx,i}$) to the PLL frequency divider 1410 to create the fractional frequency divider. The implementations discussed are applicable to both the integer and fractional frequency divider for the receive path.

When the PLL 1458 is operating in accordance with a receive mode of operation, the combiner 1432 combines the output of the first delta sigma modulator 1418 and the fourth frequency control signal (e.g., $N_{rx,i}$) and provides the result to the selector 1440. The enable/disable signal (e.g., rx) is provided to the selector 1440 to cause the selector to select the receive path. The selector 1440 provides the combined result of the output of the first delta sigma modulator 1418 and the fourth frequency control signal (e.g., $N_{rx,i}$) to the PLL frequency divider 1410 to create the fractional frequency divider for the receive path.

In some aspects of the disclosure, a phase error correction portion may be included in the PLL system 1400. A phase correction signal from the phase correction portion may be introduced in the receive path to correct errors detected in the phase of the PLL 1458. The phase error correction portion may include the combiner 1426, the combiner 1428 (e.g., a digital summer or comparator), the accumulator 1424, the logic gate 1434 (e.g., AND gate) and the flip flop 1422. As previously described with respect to FIG. 12, for example, the accumulator 1224 is coupled to the PLL and accumulates the frequency control mode (N or Ni) of the PLL frequency divider 1210. For example, the accumulator 1424 may be coupled to a node 1464 between the combiner 1432 and the combiner 1428. In one aspect of the disclosure, the accumulator 1424 is a frequency division factor (e.g., modulo 2) of the LO frequency divider 1425. For example, the accumulator 1424 is a modulo 2 accumulator when the LO frequency divider 1425 has a frequency division factor of 2.

The phase sample output, $ph_{lo}$, of the flip flop 1422 is compared (at the combiner 1428) to a predicted phase of the output of the LO frequency divider 1425. In one aspect of the disclosure, the predicted phase of the output of the LO frequency divider 1225 corresponds to the signal, acc, at the output of the accumulator 1424. The output of the combiner 1428 (which represents error in the phase sample output, $ph_{lo}$) is fed back to the PLL frequency divider 1410 via the logic gate 1434 and the combiner 1426. For example, the logic gate 1434 enables the phase error correction portion during the receive mode of operation and disables the phase error correction portion during the transmit mode of operation based on an enable signal, en.

The combiner 1426 receives integer and fractional components of the frequency control signal from the output of the combiner 1432 to control the frequency of the PLL 1458. The fractional part of the output of the combiner 1432 and subsequent fractional part of the output of the combiner 1426 cannot be directly provided to the PLL frequency divider 1410 because the PLL frequency divider 1410 can only receive integer numbers. Accordingly, the output of the combiner 1426 is processed by the selector 1440 (e.g., delta sigma selector) prior to being provided to the PLL frequency divider 1410. The selector 1440 converts the fractional part of the frequency control signal into integer bits before providing the output of the combiner 1426 to the PLL frequency divider 1410. After the delta sigma modulator (e.g., delta sigma modulator 1418) the data path does not contain any fractional bits. For instance the signal at point 1464 is equal to $N_{rx,i}+N_{rx}$ where $N_{rx}$ is the integer output of the delta sigma modulator 1418.

When a phase of the output of the LO frequency divider 1425 is maintained (e.g., no error in the phase), a signal, acc, at the output of the accumulator 1424 is aligned with the phase sample output, $ph_{lo}$, of the flip flop 1422. Under these conditions, a rising edge of acc corresponds to a "1" and is aligned with a rising edge of $ph_{lo}$, which also corresponds to a "1".

However, the signal, acc, at the output of the accumulator 1424 is not aligned with the phase sample output, $ph_{lo}$, when there is discontinuity in the output of the LO frequency divider 1425. For example, the output of the LO frequency divider 1425 is discontinuous when the LO frequency divider 1225 is turned off (LO off) and then turned on. In this case, the phase sample output, $ph_{lo}$ may include phase error that is corrected by the phase correction portion.

A phase correction signal at the output of the logic gate 1434 of the phase correction portion may be introduced in the receive path to correct detected phase error of the output of the PLL 1458. For example, the phase correction signal at the output of the logic gate 1434 may be combined with the result at the output of the combiner 1432 to generate a phase error corrected signal to the input of the selector 1440 and subsequently to the PLL frequency divider 1410. When a signal output from the flip flop 1422 is free of phase error, the phase error corrected signal at the output of the combiner 1426 is the same as the result at the output of the combiner 1432. However, when the signal outputted from the flip flop 1422 includes phase error, the result at the output of the combiner 1432 is adjusted by the phase correction signal from the logic gate 1434 at the combiner. This implementation may be performed for the receive path during the receive mode of operation.

Figure 15:
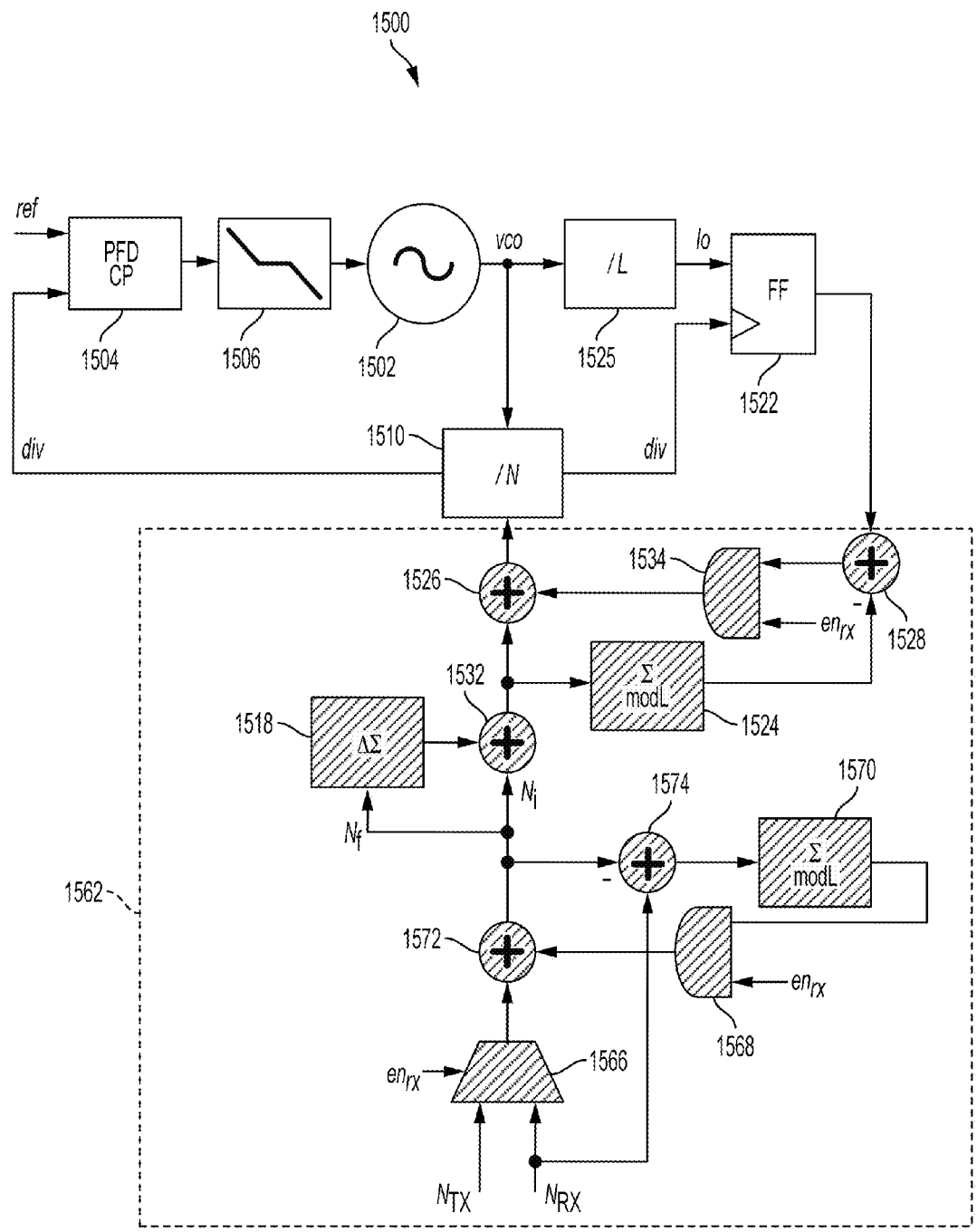
FIG. 15 is a block diagram of a phase lock loop (PLL) system illustrating a control feedback system for controlling a frequency and/or phase of a phase lock loop according to aspects of the present disclosure.

FIG. 15 is a block diagram of a phase lock loop (PLL) system 1500 illustrating a control feedback system for controlling a frequency and/or phase of a phase lock loop according to aspects of the present disclosure. The PLL system 1400 of FIG. 14 is similar to the PLL system 1500 of FIG. 15. The difference is that the control feedback system 1462 of the PLL system 1400 is different from the control feedback system 1562 of the PLL system 1500. Accordingly, the description of FIG. 15 is directed to the control feedback system 1562.

The control feedback system 1562 may be introduced to control the frequency of the PLL. For example, the control feedback system 1562 may provide control signals to a PLL frequency divider 1510 to control the frequency (and/or phase) of the PLL. The control feedback system 1562 includes a single delta sigma modulator 1518 instead of multiple delta sigma modulators as in the control feedback system 1462. The control feedback system 1562 also includes a selector 1566, a first combiner 1526, a second combiner 1528, a third combiner 1532, a fourth combiner 1572, a fifth combiner 1574, a first accumulator 1524, a second accumulator 1570, a first logic gate 1534, and a second logic gate 1568.

The PLL system 1500 also includes a phase correction portion similar to the phase correction portion of the PLL system 1400. For example, the phase correction portion of the PLL system 1500 includes the first accumulator 1524, first logic gate 1534, the first combiner 1526, the second combiner 1528 and a flip flop 1522.

Integer and fractional components (of both $N_{rx}$ and $N_{tx}$) of the control frequency signal may be selected by the selector 1566 based on the mode of operation of the PLL system 1500. For example, the integer and fractional components of $N_{rx}$ is selected for the receive mode of operation and the integer and fractional components of $N_{tx}$ is selected for the transmit mode of operation.

In the transmit mode of operation, the selector 1566 selects the integer and fractional components of $N_{tx}$ for the integer part of the PLL frequency divider 1510 while the delta sigma modulator 1518 provides the fractional part ($N_f$) of the control frequency signal to the PLL frequency divider 1510. The fractional part of the control frequency signal may be compressed into integer bits by the delta sigma modulator 1518 and then combined with the integer part of the control frequency signal at the third combiner 1532. A resultant control frequency signal is then provided to the PLL frequency divider 1510 to control the frequency of the PLL.

A phase of the PLL may be lost during operation of the PLL system 1500. For example, when the PLL system 1500 transitions from the receive mode to transmit mode and back to the receive mode, a phase of the PLL system 1500 with respect to the receive mode is lost. To maintain the phase of the PLL when returning to the receive mode of operation, the integer and fractional parts of $N_{rx}$ of the control frequency signal and the selected integer and fractional parts of $N_{tx}$ are provided to the fifth combiner 1574 during the transmit mode of operation. The fifth combiner 1574 compares $N_{tx}$ to $N_{rx}$. The difference, which corresponds to a difference in frequency of the receive mode and frequency of the transmit mode, is provided to the second accumulator 1570. The second accumulator 1570 accumulates the difference until the receive mode of operation occurs. For example, the second accumulator 1570 is a modulo L accumulator when the LO frequency divider 1525 has a frequency division factor of L. The second logic gate 1568 is turned off during the transmit mode of operation.

During the receive mode of operation, the fifth combiner 1574 receives the integer and fractional parts of $N_{rx}$ of the control frequency signal twice. Because there is no difference between the integer part of the control frequency signal during the receive mode of operation, no signal is accumulated at the second accumulator 1570 during the receive mode of operation. However, during the receive mode of operation, the second logic gate 1568 is turned on, and a phase correction signal based on the accumulated difference in frequency during the transmit mode of operation is provided to the fourth combiner 1572 to correct a phase of the PLL. The correction is based on the accumulated difference in frequency between the transmit mode of operation and the receive mode of operation. Therefore, the difference in frequency is accumulated at the second accumulator 1570 during the transmit mode of operation, and when the PLL system 1500 switches to the receive mode of operation the correction is made.

Figure 16:
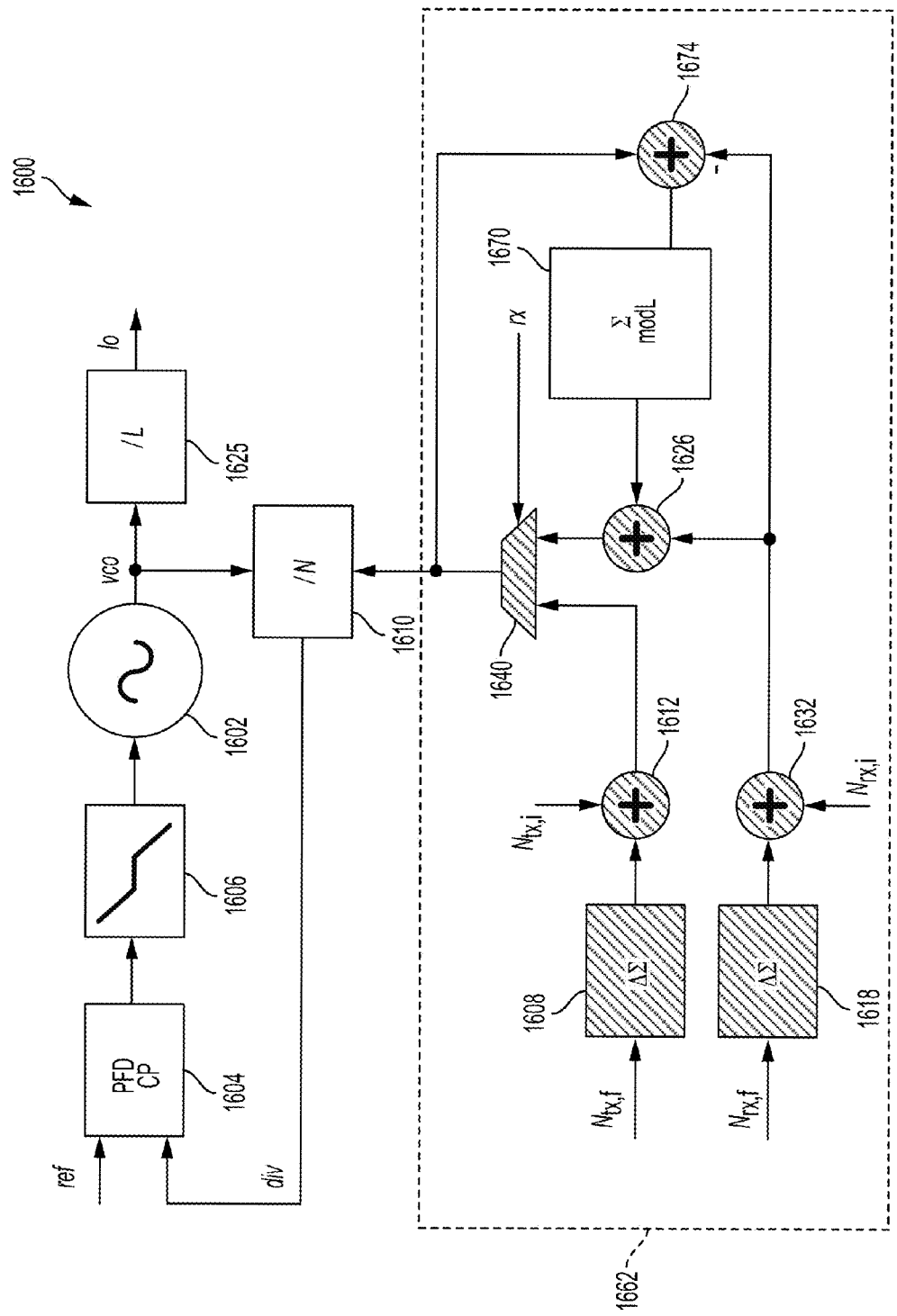
FIG. 16 is a block diagram of another phase lock loop (PLL) system illustrating a control feedback system for controlling a frequency and/or phase of a phase lock loop according to aspects of the present disclosure.

FIG. 16 is a block diagram of another phase lock loop (PLL) system 1600 illustrating a control feedback system for controlling a frequency and/or phase of a phase lock loop according to aspects of the present disclosure. The PLL system 1400 of FIG. 14 is similar to the PLL system 1600 of FIG. 16. The difference is that the control feedback system 1462 of the PLL system 1400 is different from a control feedback system 1662 of the PLL system 1600. The PLL system 1600 also does not include a flip flop and therefore avoids LO sampling discussed in FIG. 14. Phase continuity is maintained or phase error is detected and corrected independent of a flip flop. Phase continuity is achieved by the PLL system 1600 using the control feedback system 1662.

The control feedback system of FIG. 16 includes a first delta sigma modulator 1618, which is included in a receive chain, and a second delta sigma modulator 1608, which is included in a transmit chain. The control feedback system also includes a first combiner 1612, a second combiner 1626, a third combiner 1674, a fourth combiner 1632, a selector 1640 (e.g., a delta sigma selector), and an accumulator 1670. The first delta sigma modulator 1618 and the second delta sigma modulator 1608 operate similar to the first delta sigma modulator 1418 and the second delta sigma modulator 1408, as described with respect to FIG. 14. Similarly, the first combiner 1612, the second combiner 1626, and the fourth combiner 1632 operate similar to the first combiner 1412, the second combiner 1426, and the third combiner 1428, as described with respect to FIG. 14.

In operation (e.g., TDD mode) two LO frequency dividers may be introduced, one for the receive mode of operation and one for the transmit mode of operation. However, for illustrative purpose, only one LO frequency divider 1625 is shown. To save power during the receive mode of operation, the LO frequency divider corresponding to the transmit mode of operation is turned off. Similarly, the LO frequency divider corresponding to the receive mode of operation is turned off during the transmit mode of operation. Turning off the receive mode LO frequency divider (e.g., 1622) during the transmit mode causes a loss in phase of the PLL when returning to the receive mode of operation.

In one aspect of the disclosure, to maintain phase continuity without the sampling, the receive mode LO frequency divider is kept on during the transmit mode of operation. Because there is no uncertainty in the phase of the PLL for receive mode due to the receive mode LO frequency divider being on during the transmit mode, sampling can be avoided.

In some aspects of the disclosure, during the transmit mode of operation when the transmit chain including the first combiner is selected by the selector, a frequency control signal from the output of the selector is fed back to be used to maintain phase continuity during a receive mode of operation. For example, in the transmit mode of operation, the selector 1640 selects the integer component $N_{tx,i}$ and the fractional part $N_{tx,f}$ of the control frequency signal to be provided to the PLL frequency divider 1610. The resultant control frequency signal at the output of the selector 1640 is then provided to the PLL frequency divider 1610 to control the frequency of the PLL.

A phase of the PLL may be lost during operation of the PLL system 1600. For example, when the PLL system 1600 transitions from the receive mode to transmit mode and back to the receive mode, a phase of the PLL system 1600 with respect to the receive mode is lost. To maintain the phase of the PLL when returning to the receive mode of operation, the resultant control frequency signal during the transmit mode of operation is fed back. For example, during the transmit mode of operation the resultant control frequency signal is fed back to the third combiner 1674.

During the transmit mode of operation, the third combiner 1674 also receives a combination of the integer part $N_{rx,i}$ and the fractional part $N_{rx,f}$ of the control frequency signal. The third combiner 1674 compares the combination of the integer part $N_{rx,i}$ and the fractional part $N_{rx,f}$ to the resultant control frequency signal at the output of the selector 1640 during the transmit mode of operation. The difference, which corresponds to a difference in frequency of the receive mode and frequency of the transmit mode, is provided to the accumulator 1670. The accumulator 1670 accumulates the difference until the receive mode of operation occurs. For example, the accumulator 1670 is a modulo L accumulator when the LO frequency divider 1625 has a frequency division factor of L.

During the receive mode of operation, the third combiner 1674 receives the combination of the integer part $N_{rx,i}$ and the fractional part $N_{rx,f}$ of the control frequency signal twice. This follows because during the receive mode of operation, the resultant control frequency signal at the output of the selector 1640 is the combination of the integer part $N_{rx,i}$ and the fractional part $N_{rx,f}$. Because there is no difference during the receive mode of operation, no signal is accumulated at the accumulator 1670. However, during the receive mode of operation, a phase correction signal based on the accumulated difference in frequency during the transmit mode of operation is provided to the second combiner 1626 to correct a phase of the PLL. For example, the phase correction signal is based on the accumulated difference in frequency between the transmit mode of operation and the receive mode of operation. Therefore, the difference in frequency is accumulated at the accumulator 1670 during the transmit mode of operation. When the PLL system 1600 switches to the receive mode of operation the correction is made.

Figure 17:
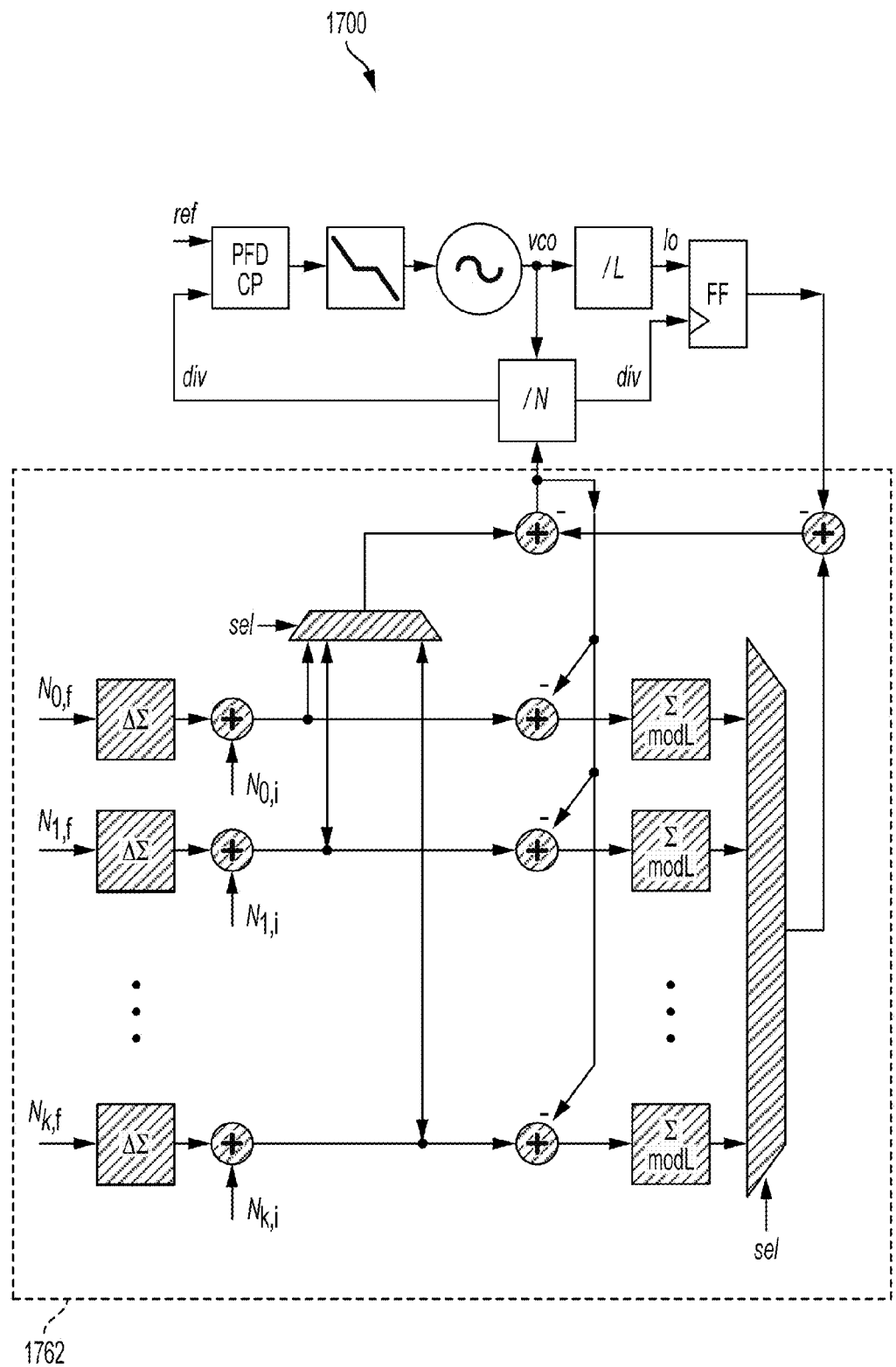
FIG. 17 is a block diagram of yet another a phase lock loop (PLL) system illustrating a control feedback system for controlling a frequency and/or phase of a phase lock loop according to aspects of the present disclosure.

FIG. 17 is a block diagram of yet another a phase lock loop (PLL) 1700 system illustrating a control feedback system for controlling a frequency and/or phase of a phase lock loop according to aspects of the present disclosure. The PLL system 1700 may operate similar to the PLL systems 1400, 1500 and 1600. The difference is that a control feedback system 1762 of the PLL system 1700 accommodates multiple frequencies. Accordingly, multiple selectors are provided to select between the multiple frequencies and their corresponding receive and transmit chains.

Figure 18A:
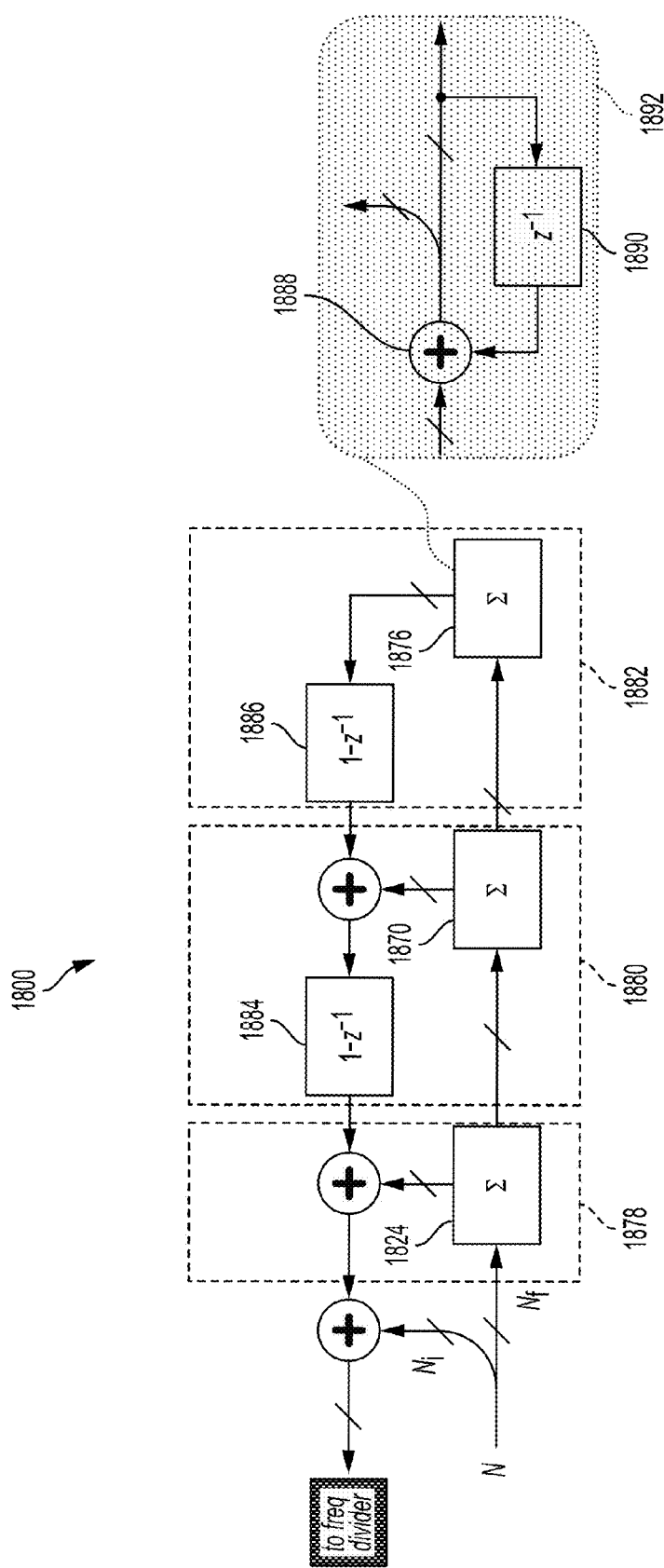
FIG. 18A illustrates a delta sigma modulator according to aspects of the present disclosure.

FIG. 18A illustrates a delta sigma modulator 1800 according to aspects of the present disclosure. The delta sigma modulator 1800 includes first, second, and third delta sigma modulator portions 1878, 1880, and 1882. The first, second, and third delta sigma modulator portions 1878, 1880, and 1882, respectively, include a first accumulator 1824, a second accumulator 1870, and a third accumulator 1876 in cascade. The second and third delta sigma modulator portions 1880 and 1882, respectively, include digital differentiators 1884 and 1886. A portion 1892 illustrates a function of each accumulator. For example, each accumulator receives a fractional portion $N_f$ of the control frequency signal at a combiner 1888 and adds to a previously stored fractional portion. The result is then stored in an accumulation portion 1890.

Figure 18B:
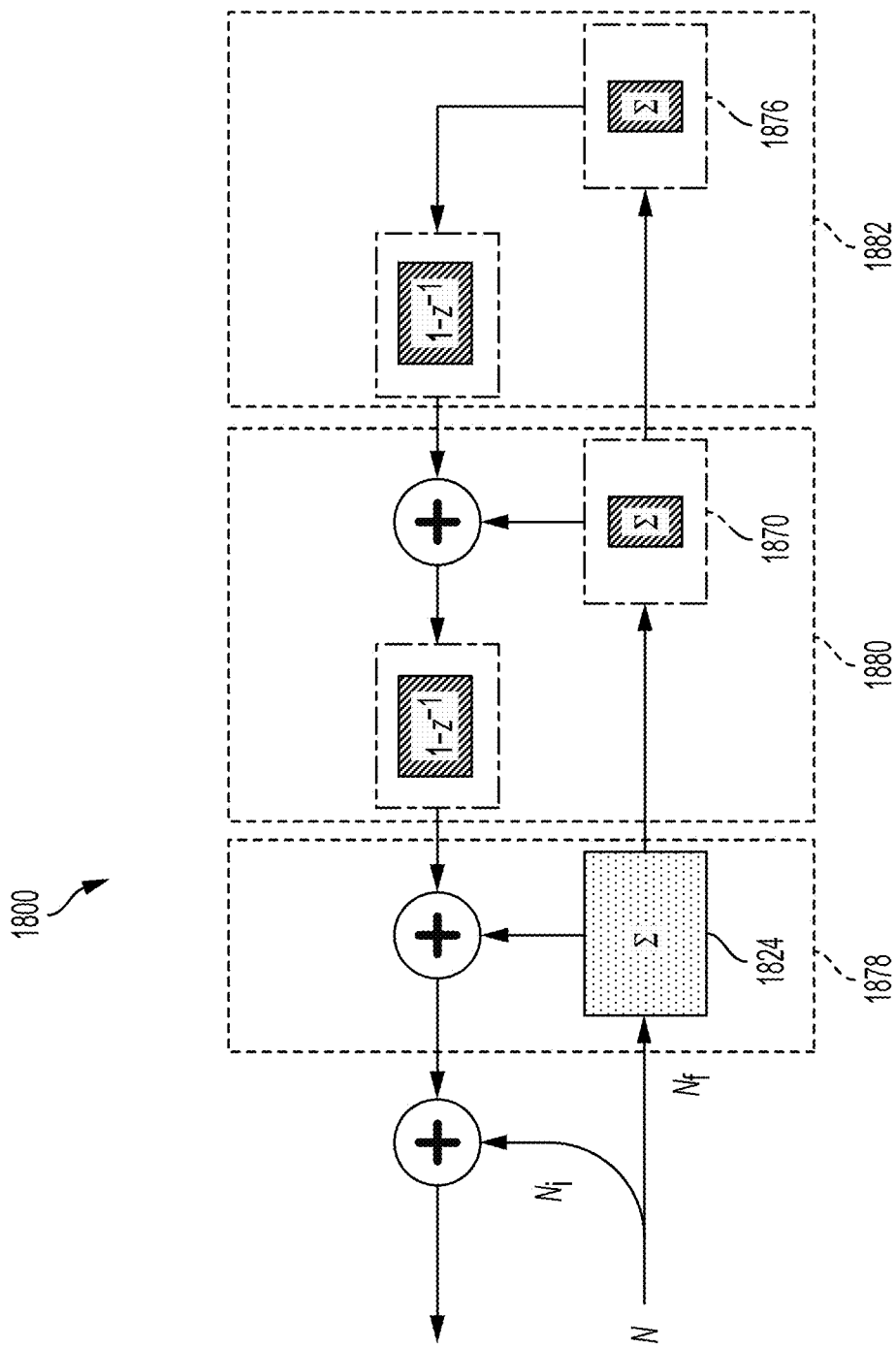
FIG. 18B illustrates the delta sigma modulator of FIG. 18A with portions of the delta sigma modulator turned off according to aspects of the present disclosure.

FIG. 18B illustrates the delta sigma modulator 1800 with portions of the delta sigma modulator 1800 turned off according to aspects of the present disclosure. For example, the first delta sigma modulator portion 1878 is kept on while the second and third delta sigma modulator portions 1880 and 1882 are turned off to save energy. The phase information of the PLL is stored in the first delta sigma modulator portion 1878 that is kept on. In this case, the first accumulator 1824 tracks a state of the phase of the PLL.

Figure 19:
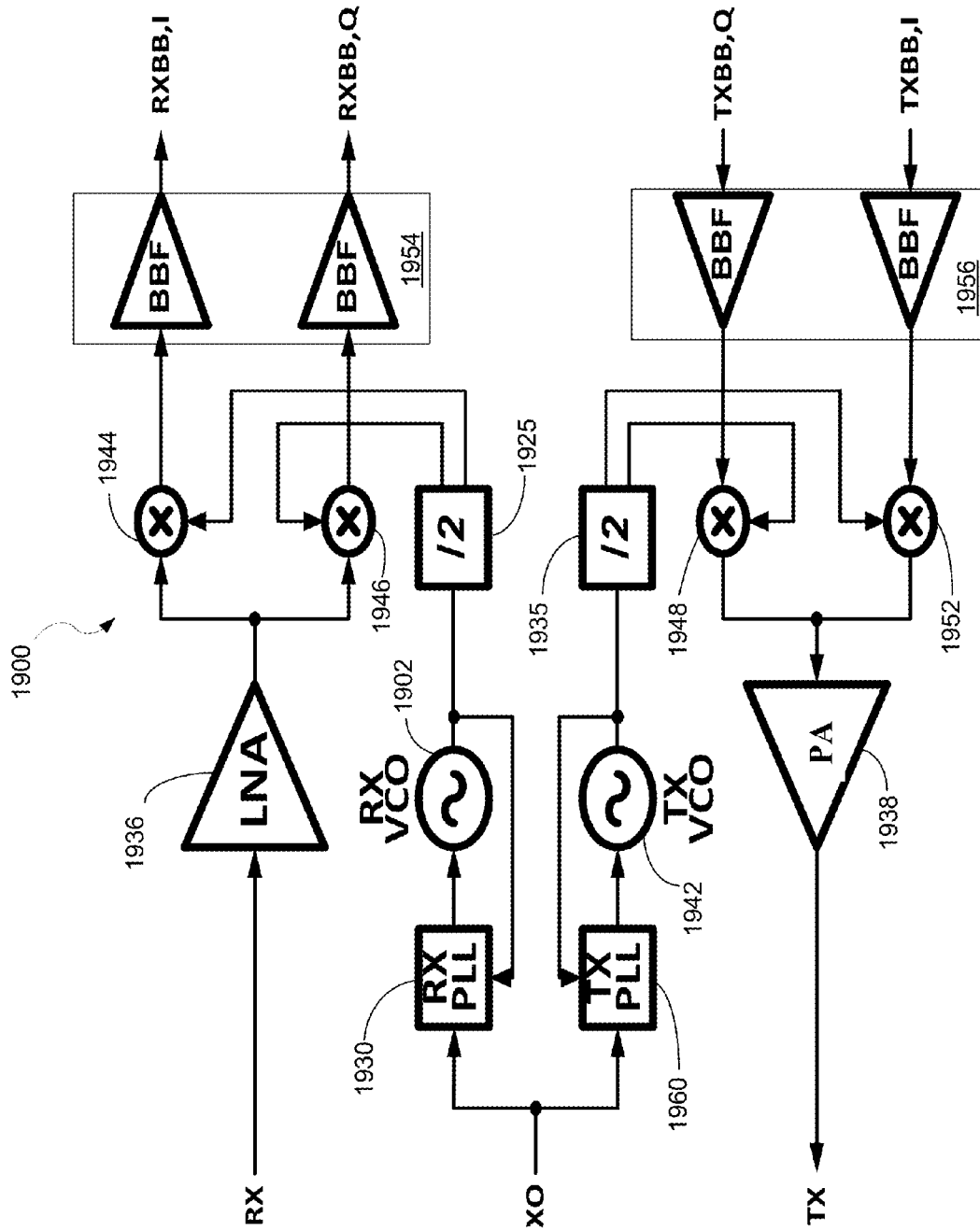
FIG. 19 illustrates a dual phase lock loop transceiver according to aspects of the present disclosure.

FIG. 19 illustrates a dual phase lock loop transceiver 1900 according to aspects of the present disclosure. The dual phase lock loop transceiver 1900 includes a transmitter and corresponding transmit chain/path and a receiver and corresponding receive path/chain. The receiver includes a low noise amplifier (LNA) 1936. The receiver may also include a receive PLL 1930, a receive VCO 1902 and a receive LO frequency divider 1925, which are used to generate the down-converting frequency for receive mixers 1944 and 1946. The output of the mixers 1944 and 1946 may be coupled to a baseband filter (BBF) 1954. The baseband filter (BBF) 1954 then outputs receive in-phase/quadrature (I/Q) signals $RXBB_I$ and $RXBB_Q$.

The transmitter includes a power amplifier (PA) 1938. The transmitter may also include a transmit PLL 1960, a transmit VCO 1942, transmit mixers 1948 and 1952, a baseband filter (BBF) 1956 and a transmit LO frequency divider 1935. An input of the mixers 1948 and 1952 may be coupled to the baseband filter (BBF) 1956. The transmitter may receive and process a respective symbol stream to provide one or more analog signals. For example, the transmitter may receive in-phase/quadrature (I/Q) signals $TXBB_I$ and $TXBB_Q$.

The signal may be conditioned by filtering, using the baseband filter (BBF) 1956, and the in-phase/quadrature (I/Q) signals ($TXBB_I$ and $TXBB_Q$). The filtered in-phase/quadrature (I/Q) signals ($TXBB_I$ and $TXBB_Q$) from the output of the baseband filter (BBF) 1956 are up-converted using the transmit mixers 1948 and 1952 as well as the transmit PLL 1960, the transmit VCO 1942 and the transmit LO frequency divider 1935. For example, the transmit PLL 1960, the transmit VCO 1942 and the transmit LO frequency divider 1935 generate an up-converting frequency for the transmit mixers 1948 and 1952. The up-converted signals at the output of transmit mixers 1948 and 1952 are then amplified by the power amplifier (PA) 1938 to provide a modulated signal suitable for transmission. A PLL reference frequency to the receive PLL 1930 and the transmit PLL 1960 may be derived from a local oscillator (LO).

Figure 20:
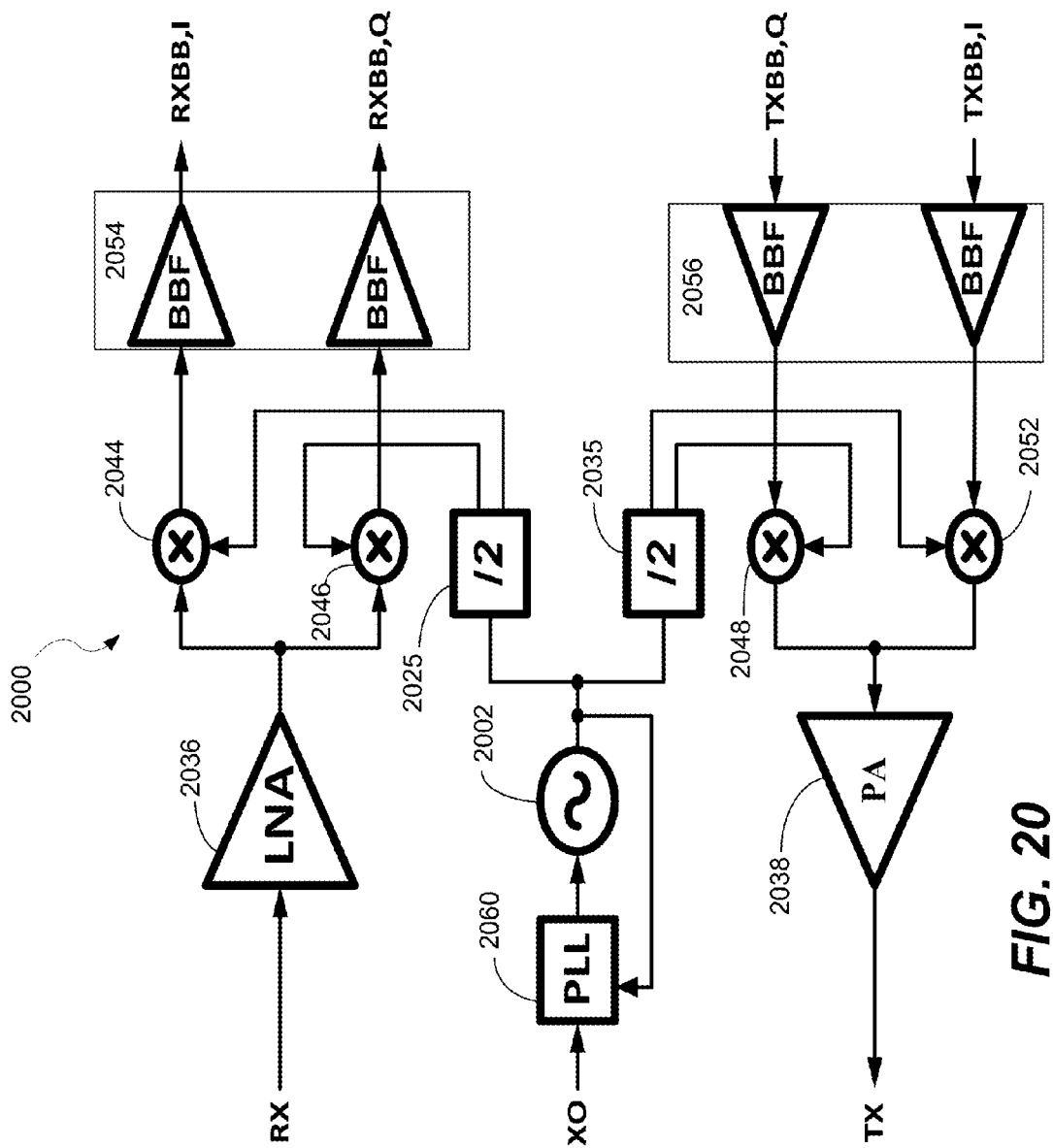
FIG. 20 illustrates a single phase lock loop transceiver according to aspects of the present disclosure.

FIG. 20 illustrates a single phase lock loop (PLL) transceiver 2000 according to aspects of the present disclosure. The transceiver 2000 is similar to the transceiver 1900. The difference between the transceivers is that the transceiver 2000 includes a single transceiver PLL 2020 and a single VCO 2002 instead of the dual PLLs and dual VCOs of the transceiver 1900. The single transceiver PLL 2020 and the single VCO 2002 of the single PLL transceiver 2000 are shared between the transmit chain and the receive chain. For example, the single transceiver PLL 2020 and the single VCO 2002 are kept on during the transmission and reception. An LO frequency divider 2035 is turned off during reception and turned on during transmission. An LO frequency divider 2025 is turned off during transmission and turned on during reception. The phase continuity and phase error detecting implementations may be applied to the single phase lock loop transceiver 2000 and the dual phase lock loop transceiver 1900.

Figure 21:
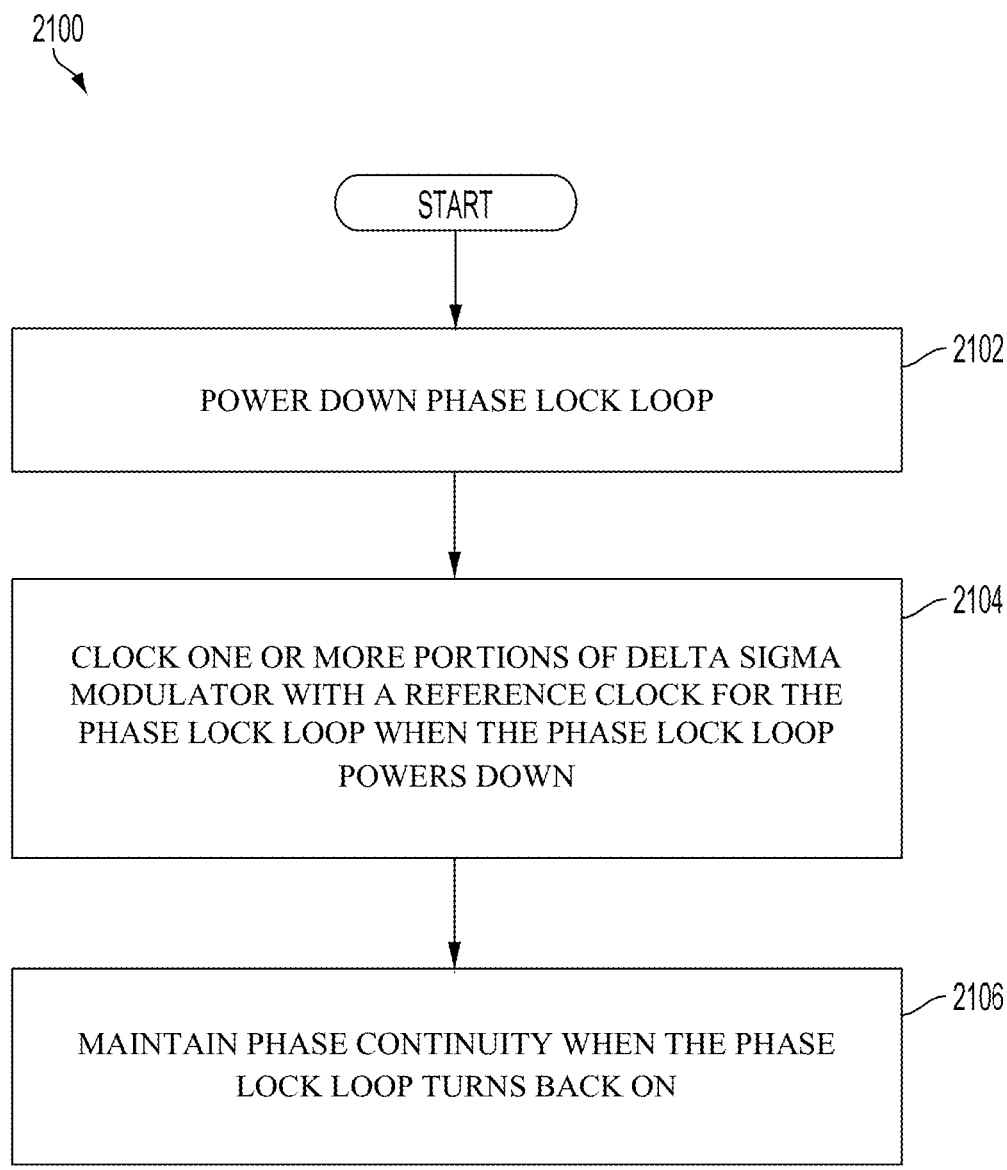
FIG. 21 is a flow diagram illustrating a process for achieving phase continuity according to various aspects of the present disclosure.

FIG. 21 is a flowchart illustrating a process for achieving phase continuity according to various aspects of the present disclosure. The process can be performed within the phase lock loop (PLL) system described in the FIGURES. At block 2102, a phase lock loop is powered down. For example, a controller or control unit (e.g., control unit 210) may generate a signal to cause the PLL to power down. At block 2104, one or more portions of a delta sigma modulator is clocked with a reference clock for the PLL when the PLL powers down. At block 2106, phase continuity is maintained when the PLL is turned back on.

According to a further aspect of the present disclosure, an apparatus for wireless communication is described. The apparatus includes a means for generating a reference clock signal to clock one or more portions of a delta sigma modulator with the reference clock signal when the first phase lock loop powers down. The reference clock signal generating means may be the reference signal source device 1116, as shown in FIG. 11. The reference signal source device 1116 may be implemented in conjunction with a control unit (e.g., control unit 210). The reference signal source device may be a reference signal generating source such as a crystal or reference clock. The apparatus also includes means for maintaining phase continuity. The phase continuity maintaining means may be the control unit 210, shown in FIGS. 2 and 3, and/or the reference signal source device 1116, as shown in FIG. 11. In another aspect, the aforementioned means may be any module, or any apparatus configured to perform the functions recited by the aforementioned means.

Figure 22:
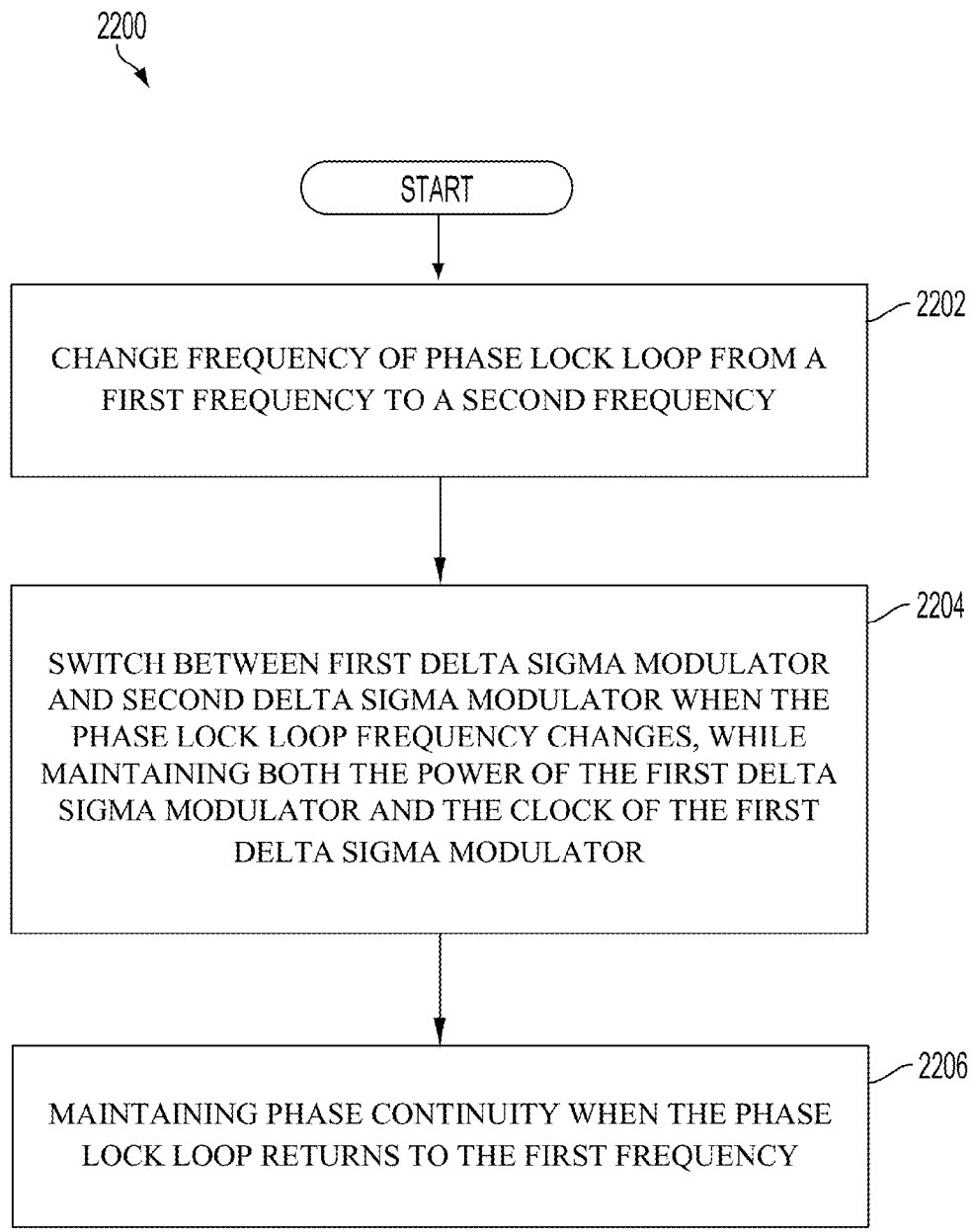
FIG. 22 is a flow diagram illustrating phase continuity method for a phase lock loop system according to an aspect of the present disclosure.

FIG. 22 is a process flow diagram illustrating a phase continuity method for a phase lock loop system according to an aspect of the present disclosure. At block 2202, a frequency of a phase lock loop (PLL) is changed from a first frequency to a second frequency. For example, a controller or control unit (e.g., control unit 210) may cause the frequency to change. At block 2204, the PLL is switched between a first delta sigma modulator (DSM) and a second DSM when the PLL frequency changes, while maintaining both the power of the first DSM and the clock of the first DSM. At block 2206, phase continuity is maintained when the PLL returns to the first frequency.

Figure 23:
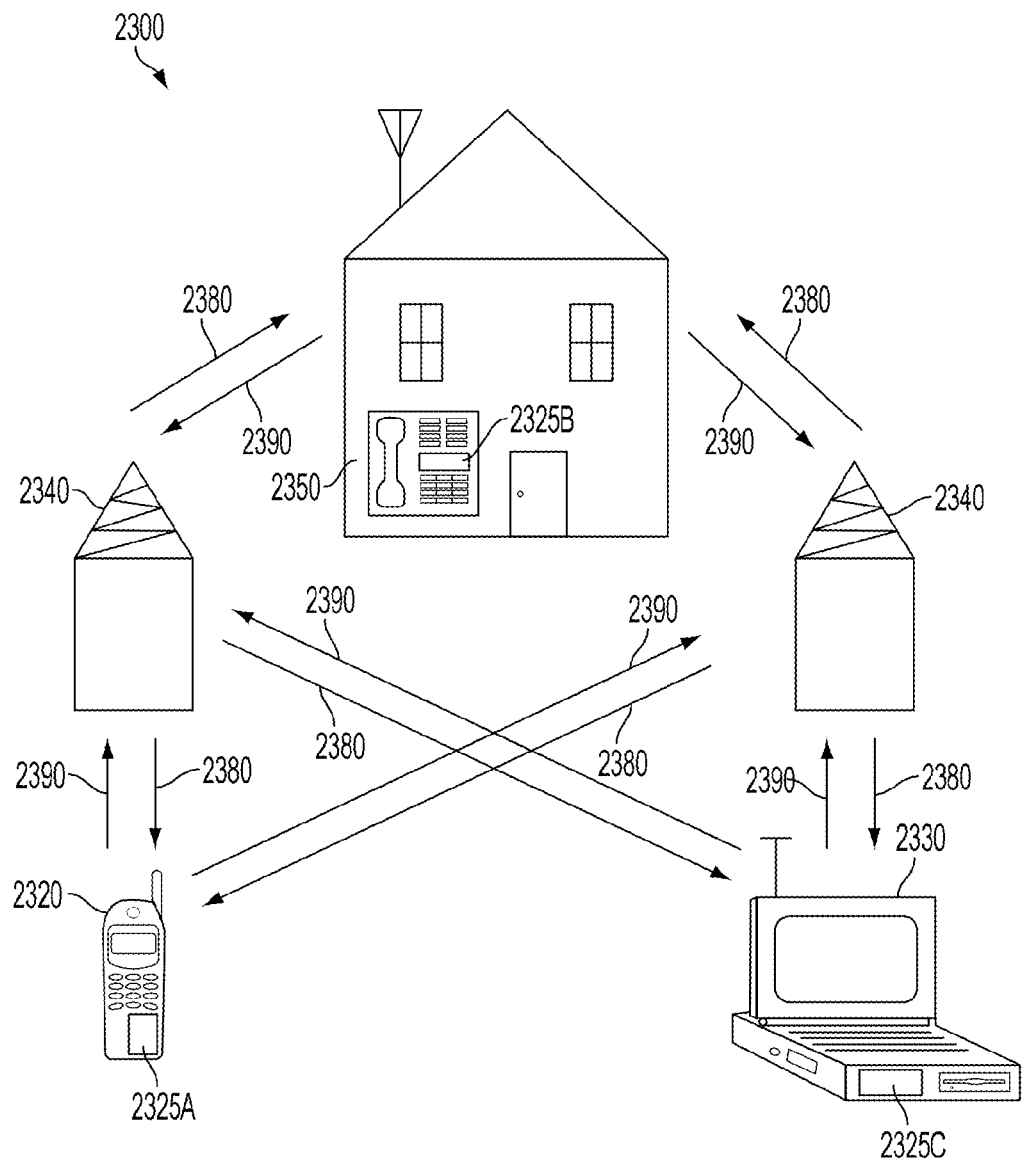
FIG. 23 is a block diagram showing an exemplary wireless communication system in which an aspect of the disclosure may be advantageously employed.

FIG. 23 is a block diagram showing an exemplary wireless communication system in which an aspect of the disclosure may be advantageously employed. For purposes of illustration, FIG. 23 shows three remote units 2320, 2330, and 2350 and two base stations 2340. It will be recognized that wireless communication systems may have many more remote units and base stations. Remote units 2320, 2330, and 2350 include IC devices 2325A, 2325C, and 2325B that include the disclosed phased lock loop systems. It will be recognized that other devices may also include the disclosed phased lock loop systems, such as the base stations, user equipment, and network equipment. FIG. 23 shows forward link signals 2380 from the base station 2340 to the remote units 2320, 2330, and 2350 and reverse link signals 2390 from the remote units 2320, 2330, and 2350 to base station 2340.

In FIG. 23, remote unit 2320 is shown as a mobile telephone, remote unit 2330 is shown as a portable computer, and remote unit 2350 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 23 illustrates remote units according to the aspects of the disclosure, the disclosure is not limited to these exemplary illustrated units. Aspects of the disclosure may be suitably employed in many devices, which include the disclosed phased lock loop system.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. Accordingly, the scope of the present disclosure is intended to be defined only by reference to the appended claims.

What is claimed is:

1. A method of wireless communication, comprising:
   powering down a first phase lock loop during a transmit subframe in time division duplex (TDD) communications;
   clocking at least a portion of a delta sigma modulator with a reference clock for the first phase lock loop when the first phase lock loop powers down; and
   maintaining phase continuity when the first phase lock loop turns back on.

2. The method of claim 1, in which the first phase lock loop is a fractional-N phase lock loop.

3. The method of claim 1, in which clocking at least a portion of the delta sigma modulator comprises clocking all of the delta sigma modulator or clocking only a portion of the delta sigma modulator.

4. A method of wireless communication, comprising:
   changing a frequency of a phase lock loop from a first frequency to a second frequency;
   switching between a first delta sigma modulator and a second delta sigma modulator when the frequency of the phase lock loop changes, while maintaining power on both the first delta sigma modulator and a clock of the first delta sigma modulator; and
   maintaining phase continuity when the phase lock loop returns to the first frequency.

5. The method of claim 4, in which the changing occurs when transitioning to a transmit subframe in time division duplex (TDD) communications.

6. The method of claim 4, in which the first delta sigma modulator comprises a receive delta sigma modulator and the first frequency comprises a receive frequency.

7. The method of claim 4, in which the second delta sigma modulator comprises a transmit delta sigma modulator and the second frequency comprises a transmit frequency.

8. The method of claim 4, in which the first delta sigma modulator is assigned to the first frequency and the second delta sigma modulator is assigned to the second frequency to maintain a phase of the first frequency and the second frequency.

9. The method of claim 4, further comprising assigning only a single delta sigma modulator and allocating an accumulator within the single delta sigma modulator that tracks a difference between receive (Rx) and transmit (Tx) frequencies.

10. An apparatus comprising:
    a first phase lock loop including a delta sigma modulator;
    a second phase lock loop, the first phase lock loop and the second phase lock loop associated with frequency division duplex (FDD) communications;
    a control unit coupled to the first phase lock loop, the control unit configured to cause the first phase lock loop to power down; and
    a reference clock device coupled to the delta sigma modulator, the reference clock device configured to generate a reference clock signal to clock at least a portion of the delta sigma modulator with the reference clock signal when the first phase lock loop powers down, the control unit configured to maintain phase continuity when the first phase lock loop turns back on based at least in part on the clocking, in which the control unit causes the first phase lock loop to power down during sleep mode while the delta sigma modulator and the reference clock of the first phase lock loop stay active to maintain phase continuity.

11. The apparatus of claim 10, in which the first phase lock loop is a fractional-N phase lock loop.

12. The apparatus of claim 10, in which the reference clock device generates a reference clock signal to clock all of the delta sigma modulator or only a portion of the delta sigma modulator.

13. An apparatus comprising:
    a control unit coupled to a phase lock loop;
    a first delta sigma modulator coupled to the phase lock loop; and
    a second delta sigma modulator coupled to the phase lock loop, the control unit configured to change a frequency of the phase lock loop from a first frequency to a second frequency, the control unit configured to cause a switch between the first delta sigma modulator and the second delta sigma modulator when the frequency of the phase lock loop changes, while maintaining power on both the first delta sigma modulator and a clock of the first delta sigma modulator, the control unit configured to maintain phase continuity when the phase lock loop returns to the first frequency based at least in part on the maintaining of the power on both the first delta sigma modulator and the clock of the first delta sigma modulator.

14. The apparatus of claim 13, in which the control unit is configured to change the frequency of the phase lock loop when transitioning to a transmit subframe in time division duplex (TDD) communications.

15. The apparatus of claim 13, in which the first delta sigma modulator comprises a receive delta sigma modulator and the first frequency comprises a receive frequency.

16. The apparatus of claim 13, in which the second delta sigma modulator comprises a transmit delta sigma modulator and the second frequency comprises a transmit frequency.

17. The apparatus of claim 13, further comprising an accumulator within an assigned one of the first delta sigma modulator or the second delta sigma modulator, the accumulator configured to track a difference between receive (Rx) and transmit (Tx) frequencies.

* * * * *